(12) United States Patent
Kamei et al.

(10) Patent No.: US 6,785,182 B2
(45) Date of Patent: Aug. 31, 2004

(54) NONVOLATILE SEMICONDUCTOR MEMORY DEVICE

(75) Inventors: Teruhiko Kamei, Yokohama (JP); Masahiro Kanai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/361,573

(22) Filed: Feb. 11, 2003

(65) Prior Publication Data

US 2003/0164517 A1 Sep. 4, 2003

(30) Foreign Application Priority Data

Feb. 13, 2002 (JP) ........................................ 2002-035852

(51) Int. Cl.[7] .............................................. G11C 11/00
(52) U.S. Cl. ............. 365/226; 365/189.09; 365/185.23; 365/230.06
(58) Field of Search ........................... 365/226, 189.09, 365/185.23, 230.06

(56) References Cited

U.S. PATENT DOCUMENTS

| | | | |
|---|---|---|---|
| 5,408,115 A | 4/1995 | Chang | |
| 5,422,504 A | 6/1995 | Chang et al. | |
| 5,494,838 A | 2/1996 | Chang et al. | |
| 5,969,383 A | 10/1999 | Chang et al. | |
| 6,128,231 A * | 10/2000 | Chung | 365/185.23 |
| 6,141,262 A * | 10/2000 | Sudo | 365/189.09 |
| 6,177,318 B1 | 1/2001 | Ogura et al. | |
| 6,248,633 B1 | 6/2001 | Ogura et al. | |
| 6,255,166 B1 | 7/2001 | Ogura et al. | |
| 6,490,813 B1 * | 12/2002 | Oechsle | 34/445 |
| 6,498,761 B2 * | 12/2002 | Banba et al. | 365/226 |
| 2002/0021611 A1 * | 2/2002 | Banba et al. | 365/226 |
| 2002/0036925 A1 * | 3/2002 | Tanzawa et al. | 365/185.22 |
| 2002/0054531 A1 * | 5/2002 | Aruga | 365/226 |
| 2003/0034530 A1 * | 2/2003 | Kamei | 257/390 |
| 2003/0137875 A1 * | 7/2003 | Natori | 365/185.18 |
| 2003/0151070 A1 * | 8/2003 | Natori | 257/200 |
| 2003/0174558 A1 | 9/2003 | Kamei et al. | |
| 2003/0179621 A1 * | 9/2003 | Kamei et al. | 365/200 |
| 2003/0198102 A1 * | 10/2003 | Kamei et al. | 365/200 |
| 2003/0206444 A1 * | 11/2003 | Matsuda et al. | 365/185.18 |

FOREIGN PATENT DOCUMENTS

| | | |
|---|---|---|
| JP | A 7-161851 | 6/1995 |
| JP | B1 2978477 | 9/1999 |
| JP | A 2001-156188 | 6/2001 |

OTHER PUBLICATIONS

U.S. patent application Ser. No. 09/955,158, Kanai et al., filed Sep. 19, 2001.

(List continued on next page.)

Primary Examiner—Viet Q. Nguyen
(74) Attorney, Agent, or Firm—Oliff & Berridge, PLC

(57) ABSTRACT

A voltage generation section, which generates voltages for driving the control gates in a plurality of nonvolatile memory cells, has a booster circuit and a voltage control circuit. The voltage control circuit has a plurality of voltage output terminals, and switches and outputs a plurality of voltages inputted from the booster circuit to a plurality of voltage output terminals in accordance with a selection state of the nonvolatile memory cell. The voltage control circuit pre-drives a control gate line by outputting a maximum voltage among the voltages to all of the voltage output terminals in a pre-drive period. A disconnection state, in which no voltage from the booster circuit is outputted, is set in a period prior to the pre-drive period, and a power supply voltage may be outputted instead of the voltage from the booster circuit.

10 Claims, 14 Drawing Sheets

OTHER PUBLICATIONS

U.S. patent application Ser. No. 09/955,160, Kanai et al., filed Sep. 19, 2001.
U.S. patent application Ser. No. 10/115,913, Kamei, filed Apr. 5, 2002.
U.S. patent application Ser. No. 10/115,956, Kamei, filed Apr. 5, 2002.
U.S. patent application Ser. No. 10/153,611, Owa, filed May 24, 2002.
U.S. patent application Ser. No. 10/153,686, Owa, filed May 24, 2002.
U.S. patent application Ser. No. 10/153,736, Owa, filed May 24, 2002.
U.S. patent application Ser. No. 10/157,896, Kamei et al., filed May 31, 2002.
U.S. patent application Ser. No. 10/157,897, Kamei et al., filed May 31, 2002.
U.S. patent application Ser. No. 10/193,066, Kanai, filed Jul. 12, 2002.
U.S. patent application Ser. No. 10/193,602, Kanai, filed Jul. 12, 2002.
U.S. patent application Ser. No. 10/197,643, Kanai et al., filed Jul. 18, 2002.
U.S. patent application Ser. No. 10/197,644, Kamei, filed Jul. 18, 2002.
U.S. patent application Ser. No. 10/197,645, Natori, filed Jul. 18, 2002.
U.S. patent application Ser. No. 10/197,646, Kanai, filed Jul. 18, 2002.
U.S. patent application Ser. No. 10/197,668, Kanai, filed Jul. 18, 2002.
U.S. patent application Ser. No. 10/229,064, Kamei, filed Aug. 28, 2002.
U.S. patent application Ser. No. 10/246,486, Natori, filed Sep. 19, 2002.
U.S. patent application Ser. No. 10/246,665, Natori, filed Sep. 19, 2002.
U.S. patent application Ser. No. 10/246,708, Natori, filed Sep. 19, 2002.
U.S. patent application Ser. No. 10/246,727, Natori, filed Sep. 19, 2002.
U.S. patent application Ser. No. 10/323,921, Natori, filed Dec. 20, 2002.
U.S. patent application Ser. No. 10/385,661, Kamei, filed Mar. 13, 2003.
U.S. patent application Ser. No. 10/377,707, Kamei et al., filed Mar. 4, 2003.
U.S. patent application Ser. No. 10/385,506, Kamei et al., filed Mar. 12, 2003.
U.S. patent application Ser. No. 10/356,644, Kamei et al., filed Feb. 3, 2003.
U.S. patent application Ser. No. 10/377,699, Kamei et al., filed Mar. 4, 2003.
Hayashi et al., "Twin MONOS Cell with Dual Control Gates", 2000 IEEE VLSI Technology Digest of Technical Papers.
Chang et al., "A New SONOS Memory Using Source–Side Injection for Programming", IEEE Electron Device Letters, vol. 19, No. 7, Jul. 1998, pp. 253–255.
Chen et al., "A Novel Flash Memory Device with S Plit Gate Source Side Injection and ONO Charge Storage Stack (SPIN)", 1997, VLSI Technology Digest, pp. 63–64.

* cited by examiner

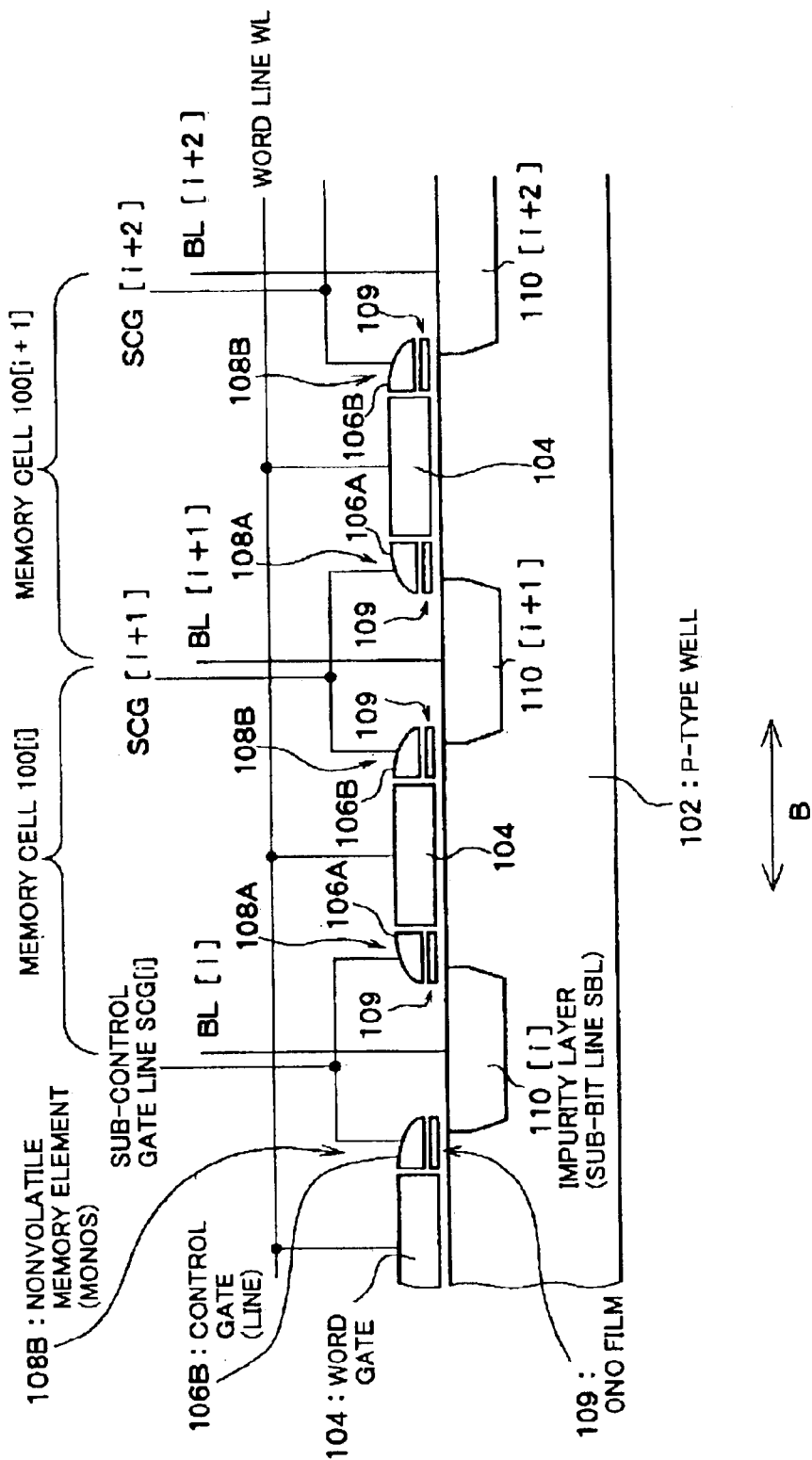

NONVOLATILE SEMICONDUCTOR MEMORY DEVICE

Japanese patent application no. 2002-35852 filed on Feb. 13, 2002, is hereby incorporated by reference in its entirety.

BACKGROUND OF THE INVENTION

The present invention relates to a nonvolatile semiconductor memory device having a nonvolatile memory cell controlled by a control gate.

A MONOS (Metal-Oxide-Nitride-Oxide-Semiconductor or -substrate) type is known as one example of the nonvolatile semiconductor memory device. In this type, a gate insulating layer between a channel and a gate is constructed by a laminating layer body of a silicon oxide film, a silicon nitride film and a silicon oxide film, and electric charges are trapped in the silicon nitride film.

This MONOS type nonvolatile semiconductor memory device is disclosed in a publication: Y. Hayashi, et al, 2000 *Symposium on VLSI Technology Digest of Technical Papers*, p. 122 –p. 123. In this publication, a MONOS flash memory cell having two nonvolatile memory cells (also called MONOS memory elements or cells) controlled by one word gate and two control gates is disclosed. Namely, one flash memory cell has two trap sites of the electric charges.

A memory cell array region is constructed by arranging a plurality of MONOS flash memory cells having such a structure in row and column directions.

Two bit lines, one word line and two control gate lines are required to operate this MONOS flash memory cell. In this case, when many memory cells are operated, these lines can be commonly connected when the same potential is set even in a different control gate.

There are erasion, a program and reading of data in the operation of the flash memory of this kind. The program and the reading of data are normally simultaneously executed by a selection cell (selected nonvolatile memory cell) of 8 bits or 16 bits.

Here, in the MONOS flash memory, a plurality of MONOS flash memory cells not separated in elements from each other are connected to one word line. When the read or the program of data is executed with respect to a certain specific selection cell, the voltage of the MONOS flash memory having this selection cell must be set and the voltage of a MONOS flash memory cell adjacent to this MONOS flash memory must be also suitably set.

For example, a case in which one of the memory cells is a selection cell and the other is a non-selection cell (called an opposite cell), will be considered. When data are read from the selection cell, a selection voltage is supplied to the control gate of the selection cell, and an override voltage is supplied to the control gate of the opposite cell, and 0 V is supplied to the control gate of the non-selection cell except for the opposite cell. These voltages are similarly supplied when data is programmed except that the values of the selection voltage and the override voltage at the data program time are merely different from those at the data read time.

Here, the override voltage is a voltage required to flow a read current or a program current by turning-on a transistor of the opposite cell irrespective of the existence or nonexistence of the program of the opposite cell.

Here, the override voltage at the data read time, and the selection voltage and the override voltage at the data program time are higher than a power supply voltage, and are supplied from a booster circuit.

In the nonvolatile semiconductor memory device of this kind, it is particularly necessary to perform a read operation at high speed. However, it took time to raise the voltage of the control gate line from 0 V to a final voltage.

BRIEF SUMMARY OF THE INVENTION

Therefore, the present invention may provide a nonvolatile semiconductor memory device able to shorten a time for raising the control gate voltage until the final voltage.

The present invention may further provide a nonvolatile semiconductor memory device able to reduce a consumed current while the raising time of the control voltage is shortened.

A nonvolatile semiconductor memory device according to the present invention includes: a memory cell array region in which a plurality of nonvolatile memory cells are arranged, each of the nonvolatile memory cells including a control gate; and a control gate voltage generation section which generates a voltage driving the control gate of each of the nonvolatile memory cells in the memory cell array region. The control gate voltage generation section includes: a booster circuit which generates a plurality of voltages; and a voltage control circuit which includes a plurality of voltage output terminals, the voltage control circuit switching and outputting the voltages from the booster circuit to the voltage output terminals in accordance with a selection state of the nonvolatile memory cells. The voltage control circuit outputs a maximum voltage among the voltages to the voltage output terminals commonly during a pre-drive period which is a period before the voltages are outputted from the voltage output terminals.

In accordance with the present invention, the maximum voltage among the final voltages is supplied to the control gate during the pre-drive period irrespective of the magnitude of the final voltage set by a control gate driver, and the maximum voltage is pre-driven. Thus, the current driving abilities of the control gate drivers while driving can be set to be approximately equal to each other. Accordingly, it is possible to shorten a period for raising the control gate voltage until the final voltage.

The nonvolatile semiconductor memory device of the present invention may further include a plurality of control gate drivers, each of the control gate drivers including a CMOS transistor which selects one voltage between one of the voltages from the voltage control circuit and a voltage equal to or lower than a ground voltage, and supplies the selected voltage to the control gate. Each CMOS transistor in these plurality of control gate drivers may be switched in accordance with a change of a memory address. The voltage control circuit may set the pre-drive period after a switching period of the CMOS transistor has passed.

In the switching period of the CMOS transistor, a through current flows in the CMOS transistor. When the pre-drive period is set in this switching period, the maximum voltage is supplied from the booster circuit to the CMOS transistor. Accordingly, the voltage of the booster circuit drops by the through current.

The voltage control circuit may set the pre-drive period over a predetermined period based on an address transition signal which changes at a transition time of the memory address in order to set the pre-drive period by avoiding the switching period of the CMOS transistor.

In the above feature, the voltage control circuit may have first and second voltage input terminals and first and second voltage output terminals, and may control switching of a connection state between the first and second voltage input terminals and the first and second voltage output terminals in accordance with the selection state of the nonvolatile memory, cells.

In this feature, in the voltage control circuit, a first control gate selection voltage may be inputted to the first voltage input terminal and a first override voltage higher than the first control gate selection voltage may be inputted to the second voltage input terminal when data is read, and the first override voltage (maximum voltage) may be outputted from the first and second voltage output terminals during the pre-drive period.

Further, in the voltage control circuit, a second control gate selection voltage maybe inputted to the first voltage input terminal and a second override voltage higher than the second control gate selection voltage may be inputted to the second voltage input terminal when data is programmed, and the second override (maximum voltage) voltage may be outputted from the first and second voltage output terminals during the pre-drive period.

In this feature, the voltage control circuit may be set to a disconnection state, in which no voltage is outputted from the booster circuit to both of the first and second voltage output terminals, in a period including the switching period of the CMOS transistor.

Further, the voltage control circuit may output a power supply voltage to the first and second voltage output terminals in the period including the switching period of the CMOS transistor.

As mentioned above, the through current flows in the switching period of the CMOS transistor. Accordingly, the voltage drop in the booster circuit can be prevented by disconnecting the booster circuit from the voltage control circuit during this period. Further, the switching operation of the CMOS transistor can be realized by using the power supply voltage without using the voltage of the booster circuit.

The present invention may be applied to a nonvolatile semiconductor memory device in which memory cells are arranged in a row direction and a column direction in the memory cell array region, each of the memory cells having one word gate, and first and second nonvolatile memory cells controlled by first and second control gates. The nonvolatile semiconductor memory device having a memory cell structure except for the memory cell may be also used.

Each of the first and second nonvolatile memory cells constituting the memory cell may have an ONO film formed of an oxide film (O), a nitride film (N) and an oxide film (O) as a trap site of electric charges. In addition, other types of trap structure can be adopted.

BRIEF DESCRIPTION OF THE SEVERAL VIEWS OF THE DRAWING

FIG. 1 is a sectional view of a memory cell used in a nonvolatile semiconductor memory device in accordance with one embodiment of the present invention;

DETAILED DESCRIPTION OF THE EMBODIMENT

Figure 2A:
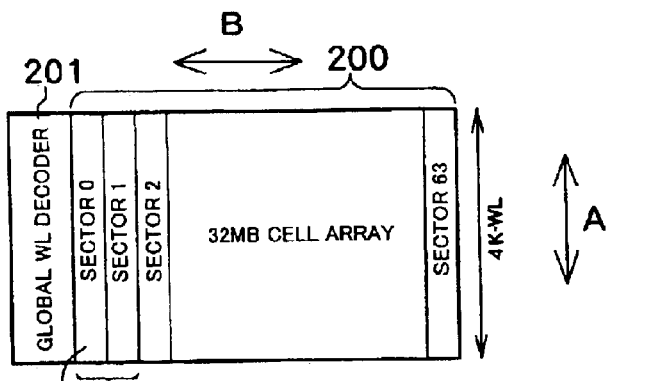
FIG. 2A is a plan layout view of the entire nonvolatile semiconductor memory device shown in FIG. 1.

The embodiments of the present invention will next be described with reference to the drawings.

Memory Cell Structure

FIG. 1 shows one section of a nonvolatile semiconductor memory device. In FIG. 1, one memory cell 100 has a word gate 104 formed from a material including polysilicon, or the like, on a P-type well 102 through a gate oxide film, first and second control gates 106A and 106B, and first and second memory elements (MONOS memory elements) 108A and 108B.

The first and second control gates 106A and 106B are formed along both sides of the word gate 104, respectively, and are electrically insulated from the word gate 104.

Each of the first and second memory elements 108A and 108B is constructed by laminating an oxide film (O), a nitride film (N) and an oxide film (O) between the P-type well 102 and one of the first and second control gates 106A and 106B formed by polysilicon corresponding to M (metal) of MONOS. The first and second control gates 106A and 106B can be also constructed by a conductive material such as silicide, or the like.

Thus, one memory cell 100 has the first and second MONOS memory elements 108A and 108B having split gates (first and second control gates 106A and 106B), and one word gate 104 is commonly used for the first and second MONOS memory elements 108A and 108B.

Each of these first and second MONOS memory elements 108A and 108B functions as a trap site of electric charges. Each of the first and second MONOS memory elements 108A and 108B can trap the electric charges in an ONO film 109.

As shown in FIG. 1, a plurality of word gates 104 spaced from each other in the row direction (a second direction B of FIG. 1) are commonly connected to one word line WL formed by polycide, or the like.

The control gates 106A and 106B shown in FIG. 1 are commonly used for a plurality of memory cells 100 extended along the column direction (a first direction A perpendicular to the surface of FIG. 1) and arranged in the column direction. Accordingly, reference numerals 106A and 106B are also called control gate lines.

Here, a sub-control gate line SCG[i+1] formed by a metallic layer above the word gate, the control, the word line or the like is connected to the control gate line 106B of an [i]th memory cell 100 [i] and the control gate line 106A of an [i+1]th memory cell 100 [i+1].

An [i+1]th impurity layer 110 [i+1] commonly used for the MONOS memory element 108B of the [i]th memory cell 100 [i] and the MONOS memory element 108A of the [i+1]th memory cell 100 [i+1] is provided in the P-type well 102.

These impurity layers 110 [i], [i+1] and [i+2] are n-type impurity layers formed within, for example, the P-type well, and function as sub-bit lines commonly used for the memory cells 100 extended along the column direction (the first direction A perpendicular to the surface of FIG. 1) and arranged in the column direction. Accordingly, reference numerals 110 [i], [i+1], [i+2] and the like. are also called sub-bit lines SBL [i], [i+1] and [i+2].

Overall Structure of Nonvolatile Semiconductor Memory Device

The overall structure of the nonvolatile semiconductor memory device constructed by using the above memory cell 100 will be described with reference to FIGS. 2A to 2E.

FIG. 2A is a plan layout view of the nonvolatile semiconductor memory device of one chip. This nonvolatile semiconductor memory device has a memory cell array region 200 and a global word line decoder 201. For example, the memory cell array region 200 has 64 sector areas 210 in total constructed by zeroth to sixty-third sector areas 210.

As shown in FIG. 2A, the memory cell array region 200 is divided into the 64 sector areas 210 in the second direction (row direction) B. Each sector area 210 has a longitudinal shape in which the first direction (column direction) A is set to the longitudinal direction. A minimum unit of data erasion is the sector area 210, and memory data within the sector area 210 are erased collectively or in time division.

For example, the memory array area 200 has 4K word lines WL and 4K bit lines BL. Here, in this embodiment, since two MONOS memory elements 108A and 108B are connected to one bit line BL, the 4K bit lines BL mean a memory capacity of 8K bits. The memory capacity of each sector area 210 is ¹⁄₆₄ of the memory capacity of the entire memory, and each sector area 210 has a memory capacity defined by (4K word lines WL)×(64 bit lines BL)×2.

Figure 2B:
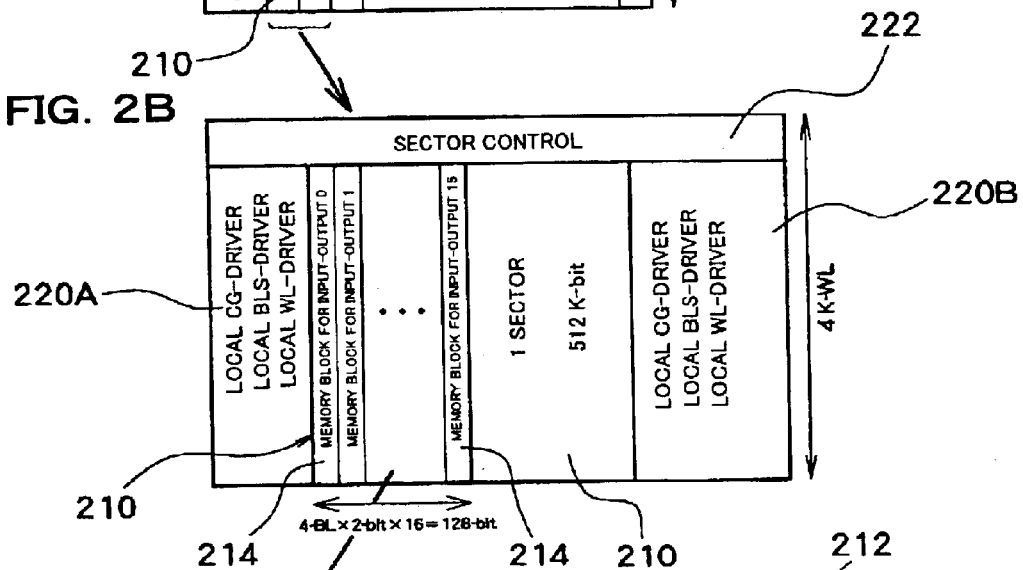
FIG. 2B is a plan view of two sector areas in FIG. 2A.

FIG. 2B shows the details of two adjacent sector areas 210 constructed by zeroth and first sector areas 210 in the nonvolatile semiconductor memory device shown in FIG. 2A. As shown in FIG. 2B, local driver areas (including a local control gate driver, a local bit line selection driver and a local word line driver) 220A and 220B are provided on both sides of the two sectors 210. For example, a sector control circuit 222 is provided on the upper sides of the two sectors 210 and the two local driver areas 220A and 220B.

Each sector area 210 is divided in the second direction B, and has 16 memory blocks (memory blocks corresponding to input-output bits) 214 for I/O0 to I/O15 so as to read and write data of 16 bits. Each memory block 214 has 4K (4096) word lines WL as shown in FIG. 2B.

Figure 2C:
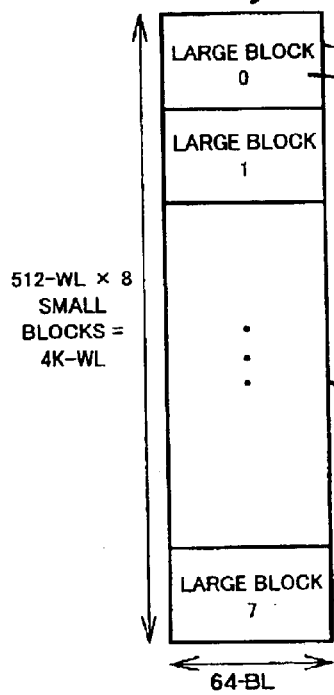
FIG. 2C is a plan view of one memory block in FIG. 2B.
Figure 2D:
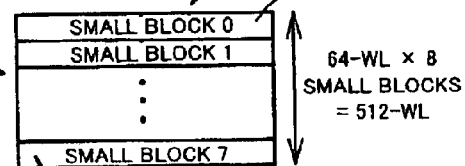
FIG. 2D is a plan view of one large block in FIG. 2C.

As shown in FIG. 2C, each one sector area 210 shown in FIG. 2B is divided into eight large blocks 212 in the first direction A. As shown in FIG. 2D, each large block 212 is divided into eight small blocks 215 in the first direction A.

Figure 2E:
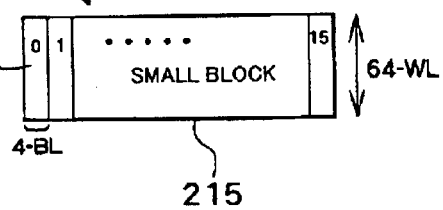
FIG. 2E is a plan view of one small block in FIG. 2D.

As shown in FIG. 2E, each small block 215 has 64 word lines WL.

Details of Sector Area

Figure 3:
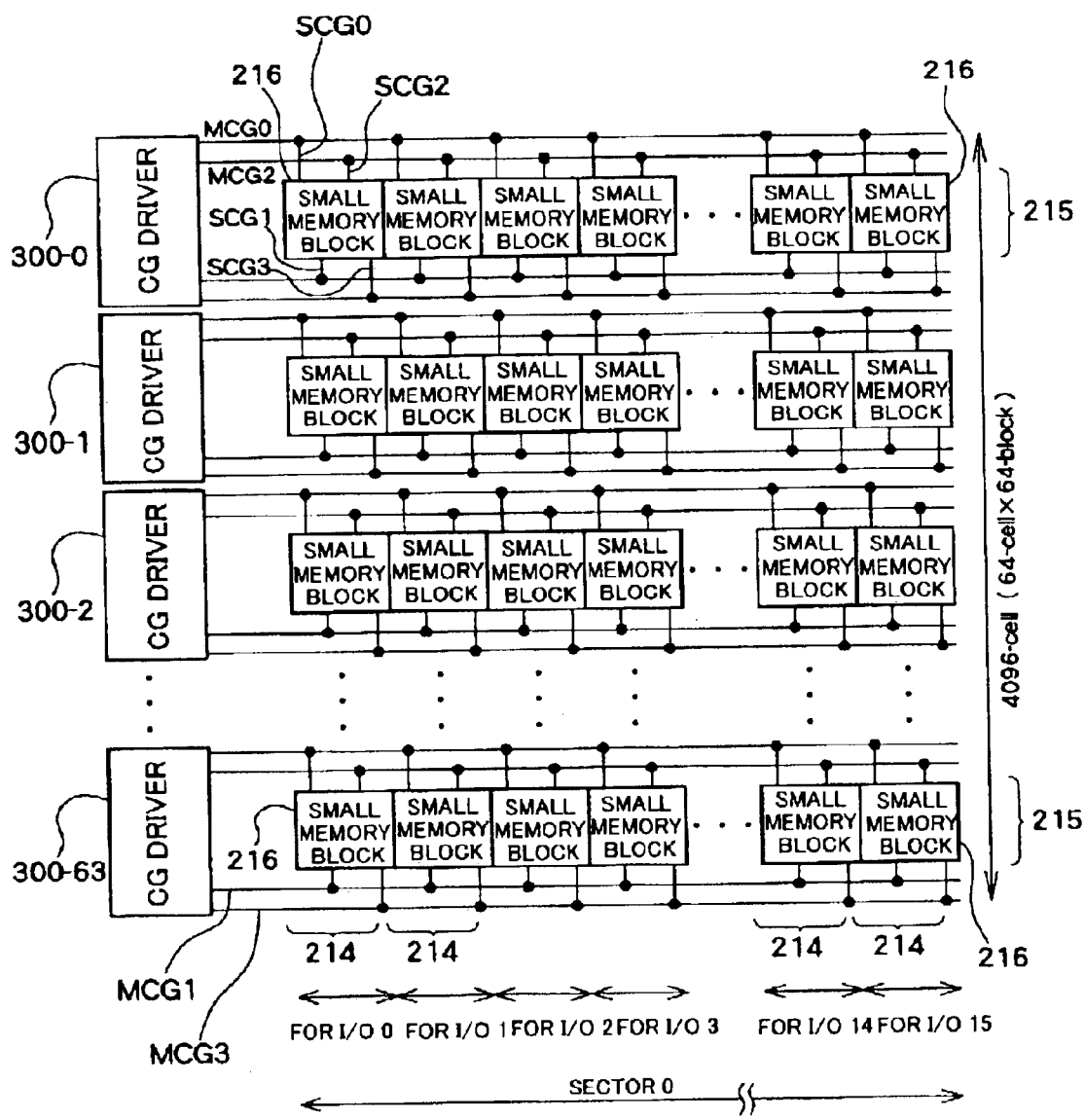
FIG. 3 is a schematic view for describing many small memory blocks in one sector area shown in FIG. 2B and interconnects for the small memory blocks.
Figure 4:
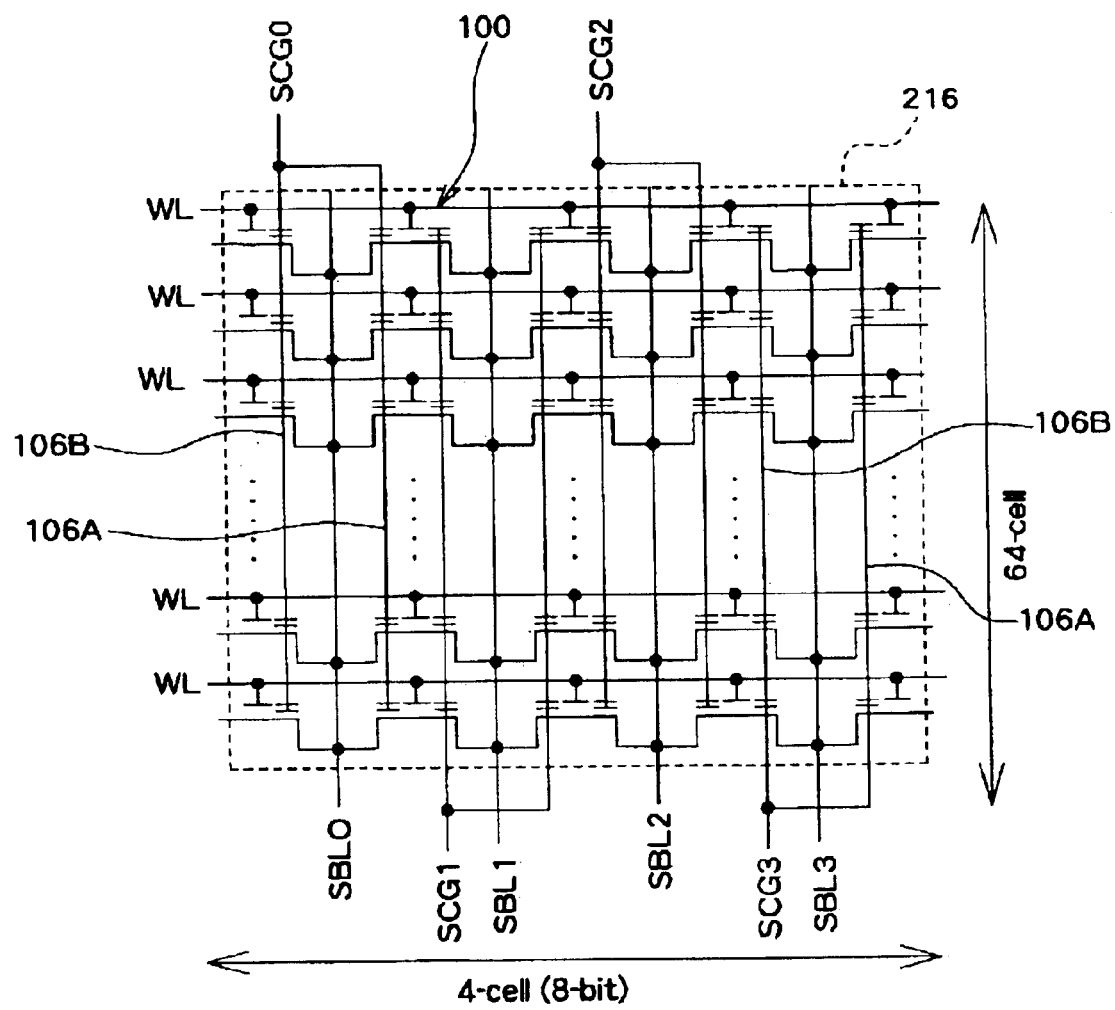
FIG. 4 is a circuit diagram of the small memory block shown in FIG. 3.

FIG. 3 shows the details of a sector area 0 shown in FIG. 2A. As shown in FIG. 4, for example, 64 memory cells 100 are arranged in the column direction and four memory cells 100 are arranged in the row direction in the small memory block 216 shown in FIG. 3. For example, four sub-control gate lines SCG0 to SCG3, four sub-bit lines SBL0 to SBL3 as input-output lines of data, and 64 word lines WL are connected to one small memory block 216.

Here, the second control gate 106B of each of the memory cells of an even series (a zeroth or second column), and the first control gate 106A of each of the memory cells of an odd series (a first or third column) are commonly connected to the even sub-control gate lines SCG0 and SCG2. Similarly, the second control gate 106B of each of the memory cells of the odd series (the first or third column), and the first control gate 106A of each of the memory cells of the even series (the second or fourth column) are commonly connected to the odd sub-control gate lines SCG1 and SCG3.

As shown in FIG. 3, 64 small memory blocks 216 (this one group is set to the small block 215) are arranged within one memory block 214 in the column direction, and 16 memory blocks 214 corresponding to sixteen I/O0 to I/O15 are arranged in the row direction to input and output data of 16 bits.

16 sub-control gate lines SCG0 of 16 small memory blocks 216 arranged in the row direction are commonly connected to a main control gate line MCG0 in the row direction. Similarly, 16 sub-control gate lines SCG1 are commonly connected to a main control gate line MCG1. Similarly, 16 sub-control gate lines SCG2 are commonly connected to a main control gate line MCG2. Similarly, 16 sub-control gate lines SCG3 are commonly connected to a main control gate line MCG3.

Each of CG drivers 300-0 to 300-63 as control gate driving portions is arranged in each small block 215 within this sector area 0. The above four main control gate lines MCG0 to MCG3 extending in the row direction are connected to each of these CG drivers 300-0 to 300-63.

Figure 5:
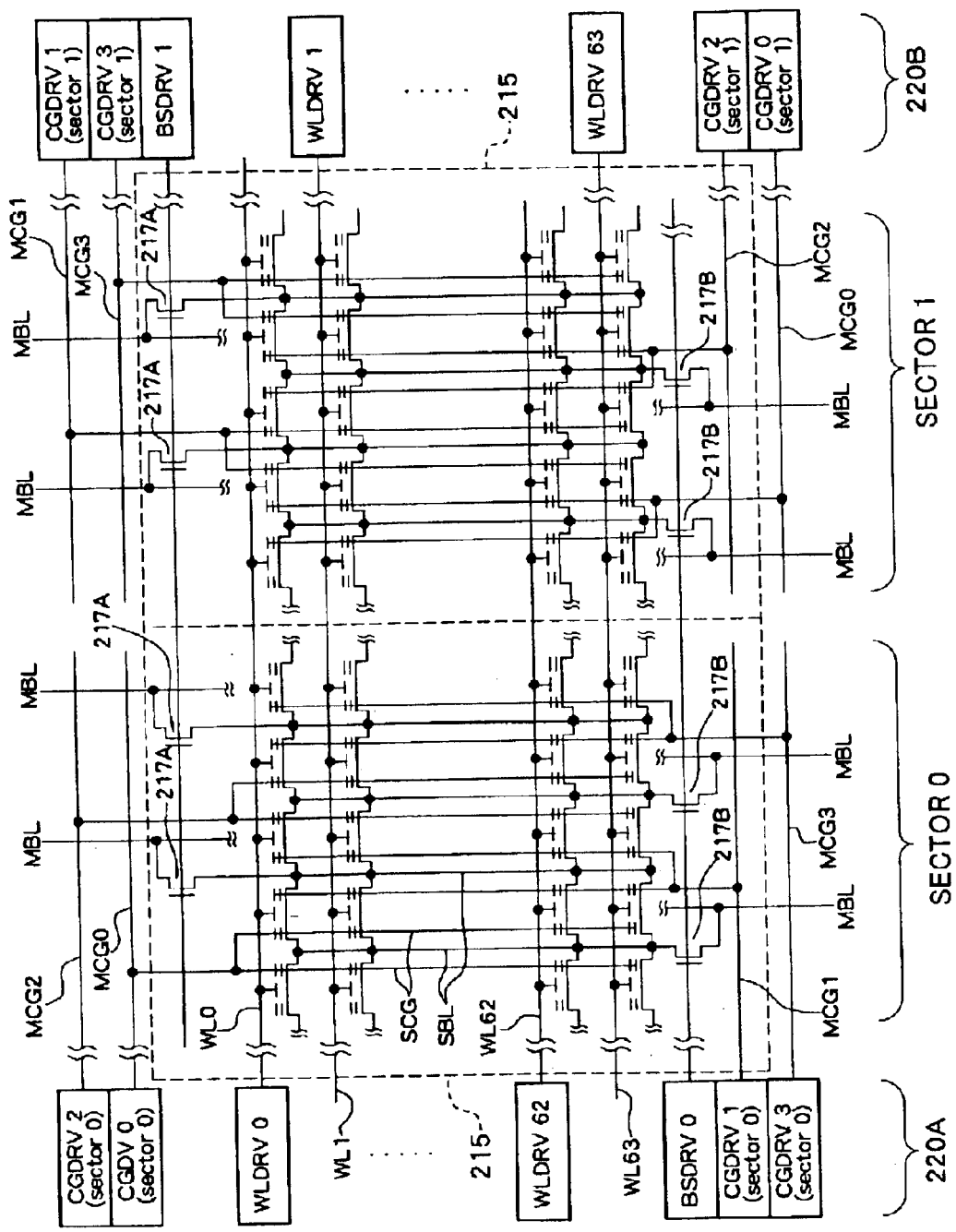
FIG. 5 is a view showing the relation of the small block shown in FIG. 3 and a local driver area.

FIG. 5 shows the relation of two small blocks 215 respectively belonging to adjacent sector areas 0 and 1. In the sector areas 0 and 1, 64 word lines WL0 to WL63 are commonly used, but the main control gate lines MCG0 to MCG3 and a main bit line MBL are respectively independently arranged. FIG. 5 particularly shows CG drivers CGDRV0 to CGDRV3 corresponding to the small block 215 within the sector area 0, and CG drivers CGDRV0 to CGDRV3 corresponding to the small block 215 within the sector area 1, and the CG drivers are independently arranged every small block 215.

Each sub-bit line SBL0 (impurity layer) provided every small block 215 is commonly connected to the main bit line MBL as a metallic wiring. This main bit line MBL is communized between the small memory blocks 216 arranged in the column direction (first direction A). Bit line selection gates 217A and 217B as bit line selection switching elements are arranged within each path from this main bit line MBL to each sub-bit line SBL0 within the small memory block. For example, the above bit line selection gate 217A is connected to an odd sub-bit line SBL, and the bit line selection gate 217B is connected to an even sub-bit line SBL.

Figure 6:
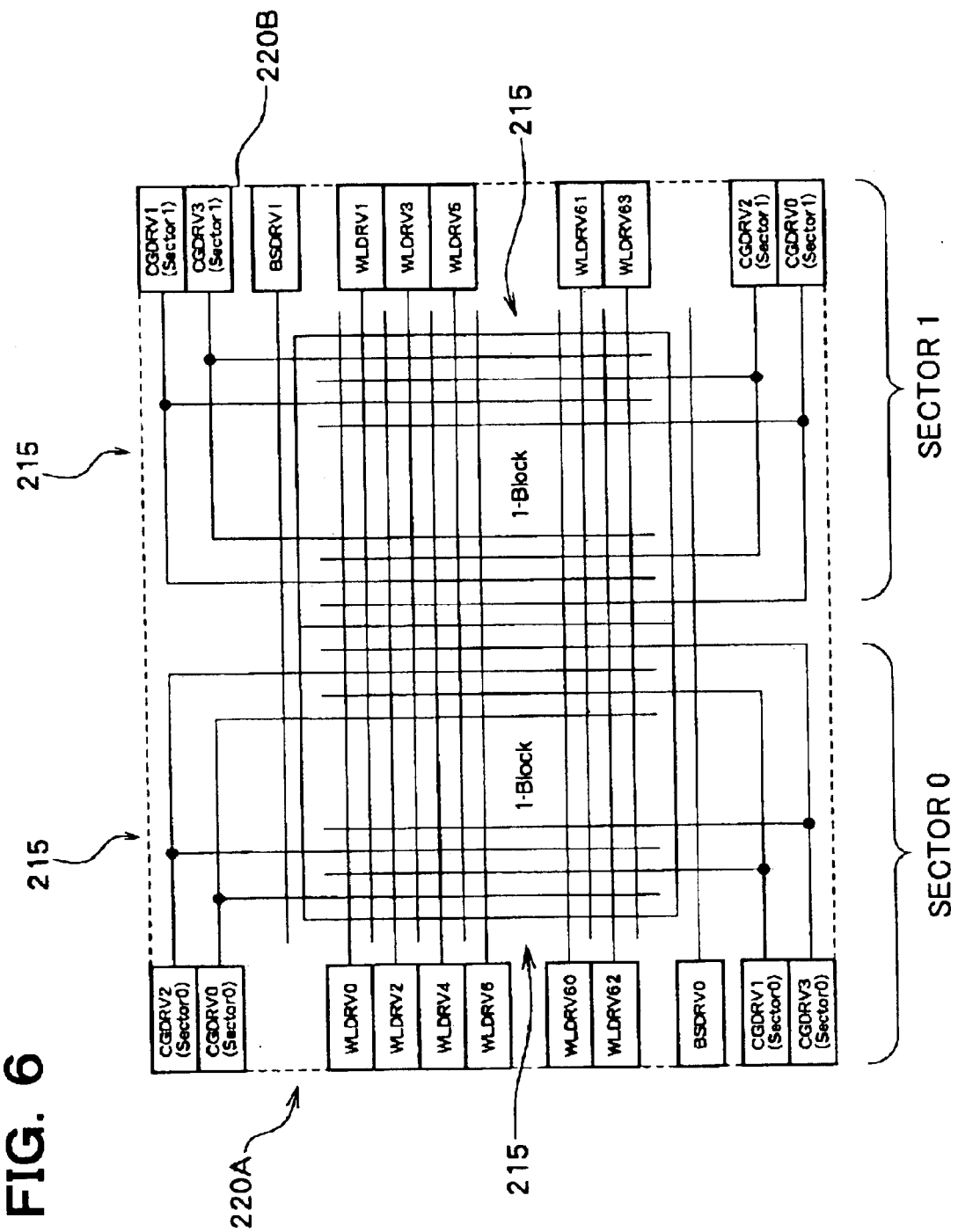
FIG. 6 is a schematic view showing the relation of two small blocks in two adjacent sectors, and the local driver area.

FIG. 6 shows the details of two small blocks 215 within the zeroth and first sector areas 210 as two adjacent sector areas 210, and local driver areas 220A and 220B on both sides of these small blocks 215. As shown in FIG. 6, four local control gate line drivers CGDRV0 to CGDRV3 shown in FIG. 5 are provided in the local driver area 220A on the left-hand side. Similarly, four local control gate line drivers CGDRV0 to CGDRV3 shown in FIG. 5 are provided in the local driver area 220B on the right-hand side.

Further, local word line drivers WLDRV0, . . . and WLDRV63 for operating even word lines WL0, WL2, . . . and WL62, within the sectors 0 and 1 are provided in the local driver area 220A on the left-hand side. Local word line drivers WLDRV1, . . . and WLDRV63 for operating odd word lines WL1, WL3, . . . and WL63, within the sectors 0 and 1 are provided in the local driver area 220B on the right-hand side.

Further, as shown in FIGS. 5 and 6, a local bit line driver BSDRV1 for operating the bit line selection gate 217A connected to, for example, an odd sub-bit line SBL of the sectors 0 and 1 is provided in the local driver area 220B on the right-hand side. A local bit line driver BSDRV0 for operating the bit line selection gate 217B connected to, for example, an even sub-bit line SBL of the sectors 0 and 1 is provided in the local driver area 220A on the left-hand side.

Drive Circuit of Sectors 0 and 1

A circuit for operating the memory cell within each small block 215 within the sectors 0 and 1 will next be described with reference to FIG. 7.

First, a pre-decoder 400, 64 global decoders 402-0 to 402-63 and Y-decoders 404 are provided as a structure commonly used for sectors 0 to 63.

The pre-decoder 400 decodes an address signal A[20-0] for specifying the nonvolatile memory cell (selection cell) of a selection object. The following Table 1 shows meaning of this address signal A[20-0].

TABLE 1

| Address | Group | Function | |
|---------|-------|----------|---|
| A [20-15] | sector | Choose 1 of 64 | |
| A [14-12] | column | Choose 1 of 8 | |
| A [11-9] | large block | Choose 1 of 8 | Choose 1 of 4096 |
| A [8-6] | small block | Choose 1 of 8 | |
| A [5-0] | row | Choose 1 of 64 | |

As shown in Table 1, one sector among 64 sectors is selected by an upper address signal A[20-15]. One bit among four cells (8-bits) within one small memory block 216 shown in FIG. 4 is selected by a middle address signal A[14-12]. One word line WL among 4096 word lines within one sector is selected by a lower address signal A[11-0]. Further, one of eight large blocks 212 existing within one sector is selected by an address signal A[11-9]. One of eight small blocks 215 existing within one large block 212 is selected by an address signal A[8-6]. One of 64 word lines WL existing within one small block 215 is selected by an address signal A[5-0].

The 64 global decoders 402-0 to 402-63 set 64 global word lines GWL[0] to GWL[63] to be active based on results obtained by pre-decoding the lower address signal A[11-0] by the pre-decoder 400. Only one global word line GWL is set to be active (Vdd) when data is read and a data program time. When the interior of one sector is collectively erased at a data erase time, all the 64 global word lines GWL are set to be active (Vdd). Thus, all the word lines WL within one sector are selected and a word line voltage for erasion is supplied.

The Y-decoder 404 operates a Y-path circuit 412 through a Y-path selection driver 410, and connects a selected bit line within the small block 215 to a sense amplifier or a bit line driver at the subsequent stage.

Figure 7:
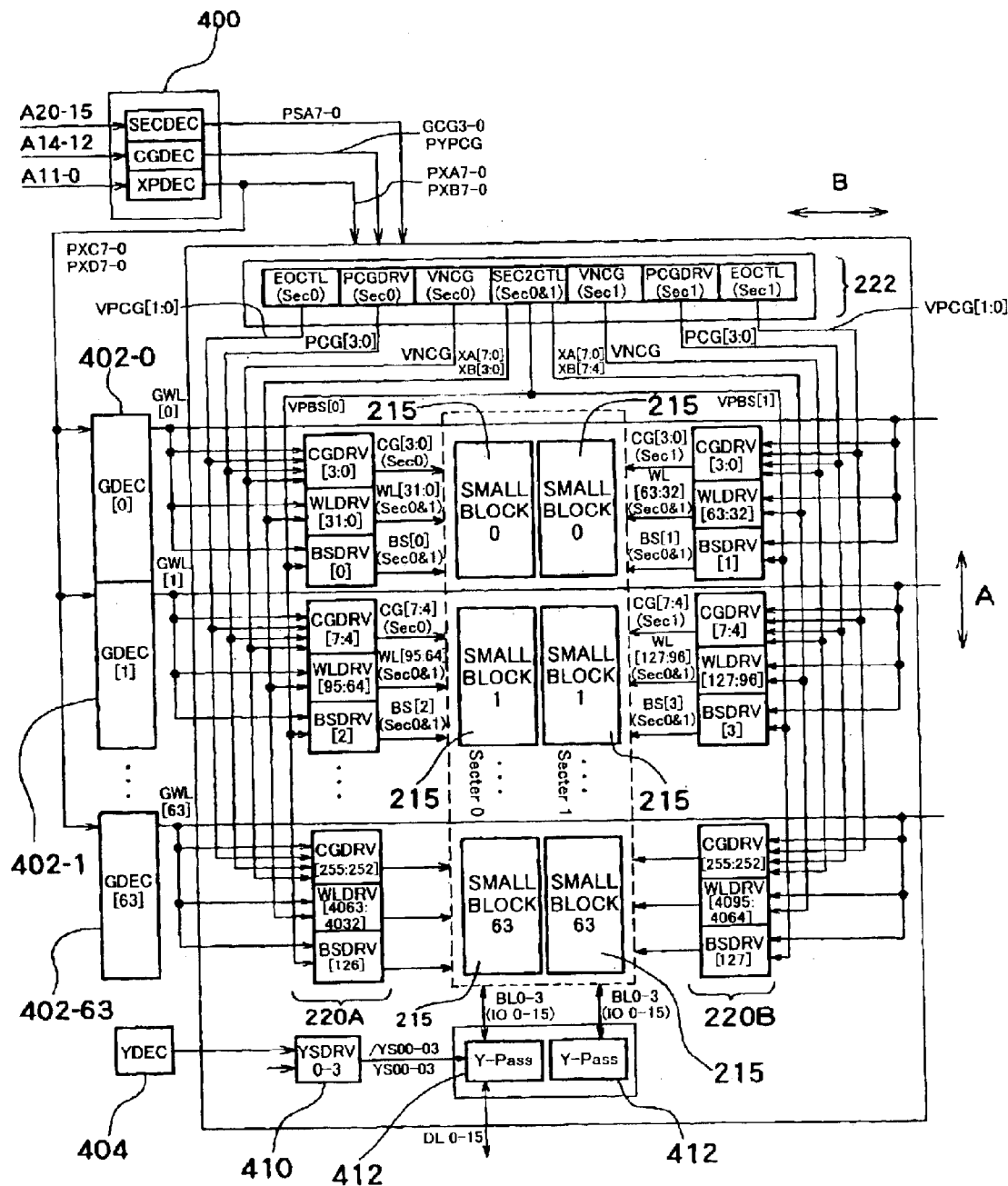
FIG. 7 is a block diagram showing a peripheral drive circuit of the two adjacent sectors.

As already described in FIGS. 5 and 6, the local driver areas 220A and 220B are provided on the left-hand and right-hand sides of each small block 215 of FIG. 7.

If a small memory block 0 in, for example, a first row within the sectors 0 and 1 is set to an example, a control gate line driver CGDRV[3-0] for operating four main control gate lines MCG within the sector 0, a word line driver WLDRV[31-0] for operating even 31 word lines WL within the sectors 0 and 1, and a bit line selection driver BSDRV[0] for operating the bit line selection transistor 217B connected to an even sub-bit line SBL within the sectors 0 and 1 are provided in the local driver area 220A on the left-hand side of the small memory block 0. A control gate line driver CGDRV[3-0] for operating four main control gate lines MCG within the sector 1, a word line driver WLDRV[63-32] for operating odd 31 word lines WL within the sectors 0 and 1, and a bit line selection driver BSDRV[1] for operating the bit line selection transistor 217A connected to an odd sub-bit line SBL within the sectors 0 and 1 are provided in the local driver area 220B on the right-hand side of the small memory block 0.

Next, the details of a sector control circuit 222 provided on, for example, the upper sides of the sectors 0 and 1 will be described with reference to FIG. 7. The sector control circuit 222 is described in detail in U.S. patent application Ser. No. 09/955,160, and the like as prior applications. Accordingly, in the following description, only a structure relative to the setting of a control gate voltage will be described in detail.

Two control gate voltage control circuits EOCTL respectively provided for the sectors 0 and 1 output two kinds of high voltages VPCG[1:0] for the control gate based on a pre-decode output from the pre-decoder 400.

Figure 8:
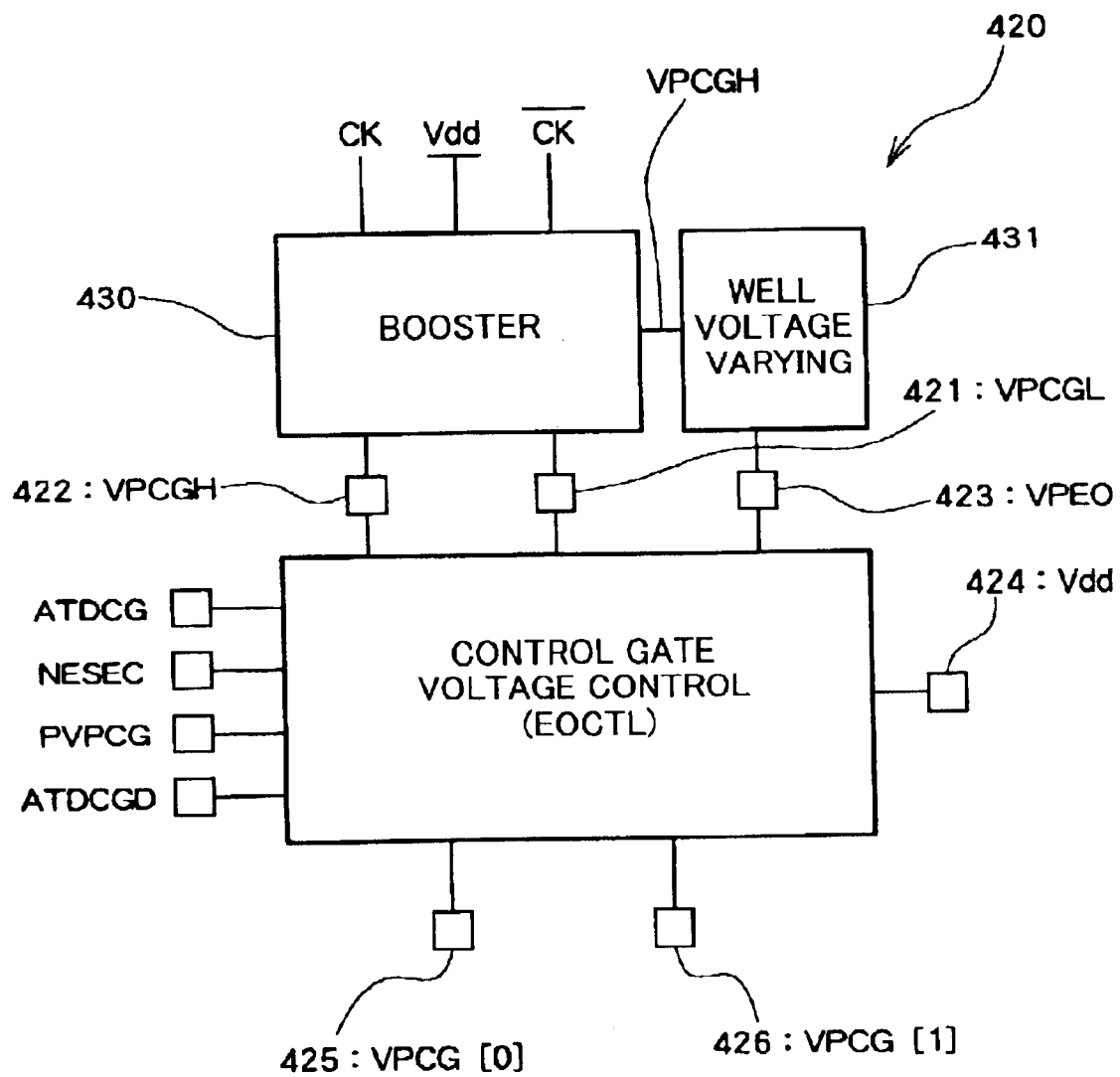
FIG. 8 is a block diagram of a control gate voltage control circuit shown in FIG. 7 and peripheral circuits of the control gate voltage control circuit.

FIG. 8 shows a control gate voltage generation circuit 420 including this control voltage control circuit EOCTL. In FIG. 8, the control voltage control circuit EOCTL has each of input terminals of control signals ATDCG, NESEC, PVPCG and ATDCGD, a first voltage input terminal 421 for inputting a voltage VPCGL thereto, a second voltage input terminal 422 for inputting a voltage VPCGH thereto, a well voltage input terminal 423 for inputting a well voltage VPEO thereto, and a power input terminal 424 for inputting a power supply voltage Vdd thereto. Further, the control gate voltage control circuit EOCTL has a first voltage output terminal 425 for outputting a high voltage VPCG[0] for the control gate, and a second voltage output terminal 426 for outputting a high voltage VPCG[1] for the control gate.

In FIG. 7, two pre-control gate line drivers PCGDRV respectively provided for the sectors 0 and 1 output a driver selection signal PCG[3:0] for setting one of four control gate line drivers CGDRV0 to CGDRV3 provided correspondingly to each small block 215 within the sectors 0 and 1 to be active based on a pre-decode output from the pre-decoder 400.

Figure 9:
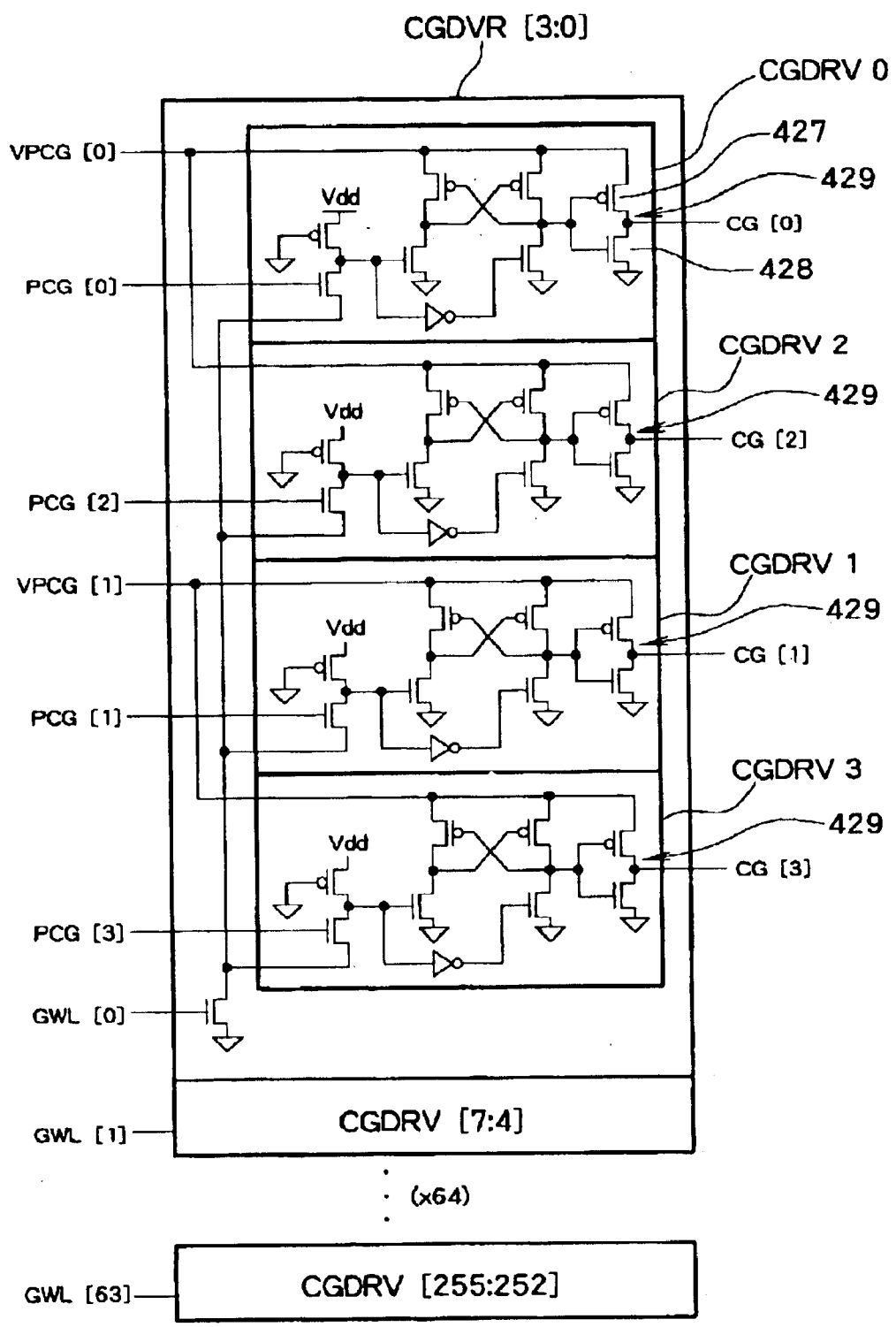
FIG. 9 is a circuit diagram showing one example of a control gate line driver CGDRV shown in FIGS. 3 and 7.

Here, the control gate line drivers CGDRV[3:0] to CGDRV[255:252] provided correspondingly to the small blocks 0 to 63 within the sector 0 correspond to control gate line drivers 300-0 to 300-63 shown in FIG. 3, and are shown in detail in FIG. 9.

In FIG. 9, the high voltage VPCG[0] for the control gate is inputted to control gate line drivers CGDRV0 and CGDRV2, and the high voltage VPCG[1] for the control gate is inputted to control gate line drivers CGDRV1 and CGDRV3.

Further, the driver selection signal PCG[3:0] is inputted to each of the corresponding control gate line drivers CGDRV0 to CGDRV3.

If the control gate line driver CGDRV0 is set to an example, a CMOS transistor 429 constructed by a P-type MOS transistor 427 and an N-type MOS transistor 428 is provided at the final stage of this control gate line driver CGDRV0. The control gate line CG[0] is connected to a portion in which the drains of the P-type MOS transistor 427 and the N-type MOS transistor 428 are connected to each other. The high voltage VPCG[0] for the control gate is outputted from the CMOS transistor 429 of the control gate line driver CGDRV0 only when a global word line signal GWL[0] is high in voltage and a driver selection signal PCG[0] is high in voltage. In the other cases, the output of the control gate line driver CGDRV0 becomes 0 V. This operation is similarly performed in the other control gate line drivers 1 to 3.

As shown in FIG. 7, two negative voltage supply circuits VNCG for the pre-control gate respectively provided for the sectors 0 and 1 supply a negative voltage VNCG (e.g., −3V) applied to the control gate at a data erase time to the four control gate line drivers CGDRV0 to CGDRV3 provided correspondingly to each small block 215 within the sectors 0 and 1 based on the pre-decode output from the pre-decoder 400.

In FIG. 9, the circuit for supplying the negative voltage VNCG at the data erase time is omitted, but collective erasion can be performed every sector by supplying the negative voltage VNCG to the control gates within all the small blocks 215 within the sector at the data erase time.

Figure 10:
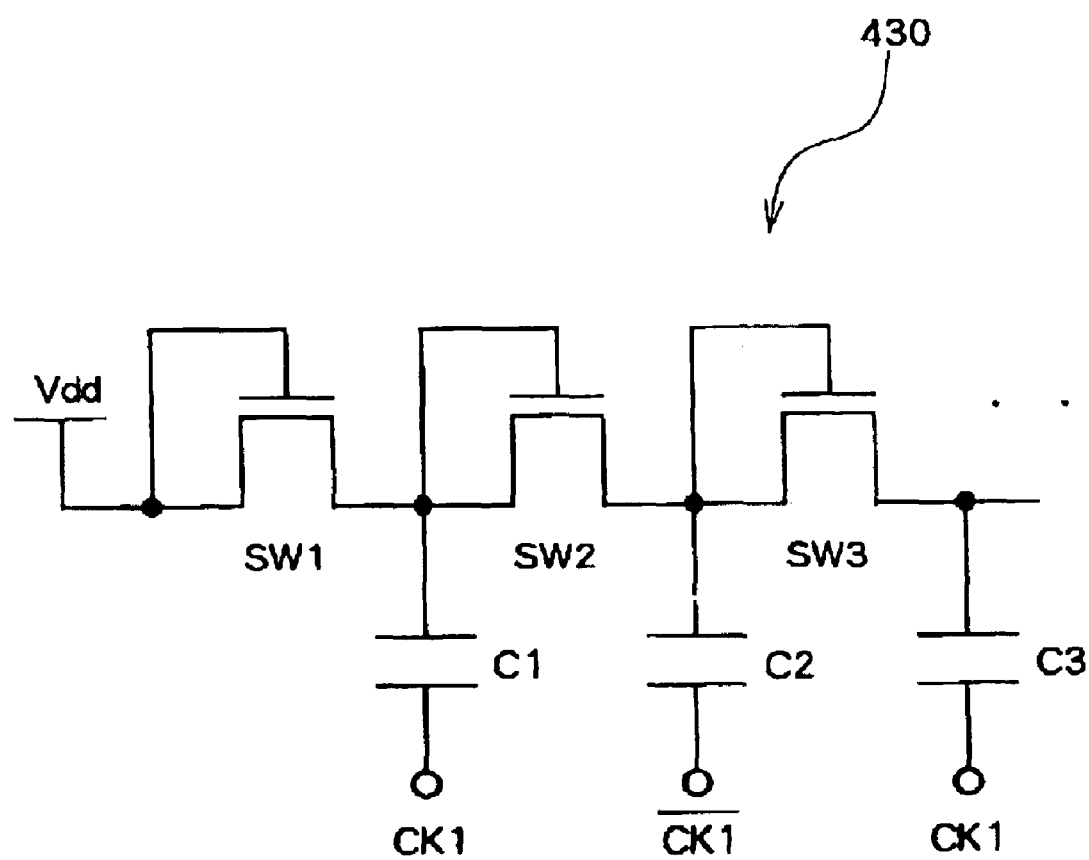
FIG. 10 is a circuit diagram showing the summary of a booster circuit shown in FIG. 8.

Two kinds of voltages VPCGL and VPCGH set to the high voltage VPCG[0,1] for the control gate are generated by the booster circuit (charge pump) 430 shown in FIG. 10, and are set to voltages different in accordance with modes. For example, when data is read, VPCGL=1.5 V (first control gate selection voltage) and VPCGH=3 V (first override voltage) are set. On the other hand, when data is programmed, VPCGL=2.5 V (second control gate selection voltage) and VPCGH=5.5 V (second override voltage) are set. In this embodiment, the power supply voltage Vdd has a variation width of about 1.8 V to 2.5 V, and voltage 1.5 V is generated by regulating the power supply voltage Vdd or the raised or lowered voltage by the booster circuit 430. Voltages 2.5 V, 3 V and 5.5 V are generated by raising the power supply voltage Vdd by the booster circuit 430.

As shown in FIG. 10, the booster circuit 430 controls the operations of capacity elements C1, C2, C3, . . . and switches SW1, SW2, SW3, . . . by clocks CK1 and /CK1, and raises the power supply voltage Vdd until a predetermined voltage. These clocks are not limited to two phase clocks, but the capacity elements and the switches may be also operated by four phase clocks, or the like.

The well voltage varying circuit 431 shown in FIG. 8 varies and controls the well voltages VPEO of P-type transistors 440 and 450 (see FIG. 11) described later based on an output from the booster circuit 430.

Figure 11:
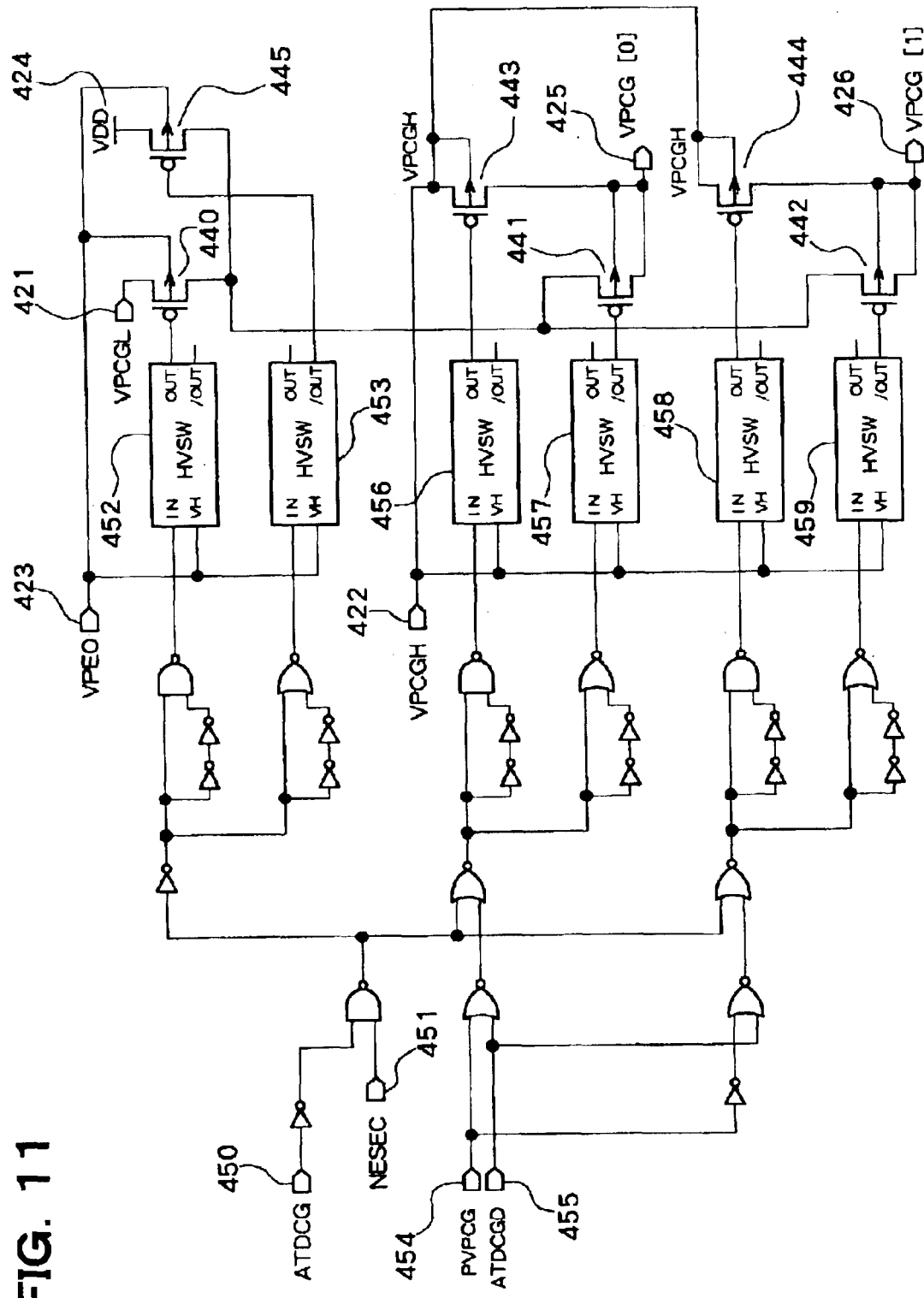
FIG. 11 is a circuit diagram showing one example of the control gate voltage control circuit shown in FIG. 8.

FIG. 11 shows one example of the control gate voltage control circuit EOCTL. In FIG. 11, this control gate voltage control circuit EOCTL switches the voltage VPCGH and the voltage VPCGL inputted through the first and second voltage input terminals 421 and 422 from the booster circuit 430 in accordance with a selection state (logic state of the control signal PVPCG) of the nonvolatile memory cell, and outputs these voltages to the first and second voltage output terminals 425 and 426. Accordingly, one of the voltage VPCGH and the voltage VPCGL is outputted as the high voltage VPCG[0] for the control gate from the first voltage output terminal 425. The other of the voltage VPCGH and the voltage VPCGL is outputted as the high voltage VPCG[1] for the control gate from the second voltage output terminal 426.

Further, before the voltage VPCGH and the voltage VPCGL are outputted from the first and second voltage output terminals 425 and 426, this control voltage control circuit EOCTL disconnects the connection with the booster circuit 430, and sets a disconnection state in which no output voltage of the booster circuit 430 is outputted from each of the first and second output terminals 425 and 426. In this embodiment, when the connection with the booster circuit 430 is disconnected, for example, the power supply voltage Vdd is outputted from the first and second voltage output terminals 425 and 426.

Therefore, P-type transistors 440, 441 and 442 are arranged within a path for supplying the voltage VPCGL from the first and second voltage output terminals 425 and 426. Further, P-type transistors 443 and 444 are arranged within a path for supplying the voltage VPCGH to the first and second voltage output terminals 425 and 426. Further, a P-type transistor 445 is provided between a supply line of the voltage VPCGL and the power input terminal 424 to supply the power supply voltage Vdd to the first and second voltage output terminals 425 and 426.

Figure 12:
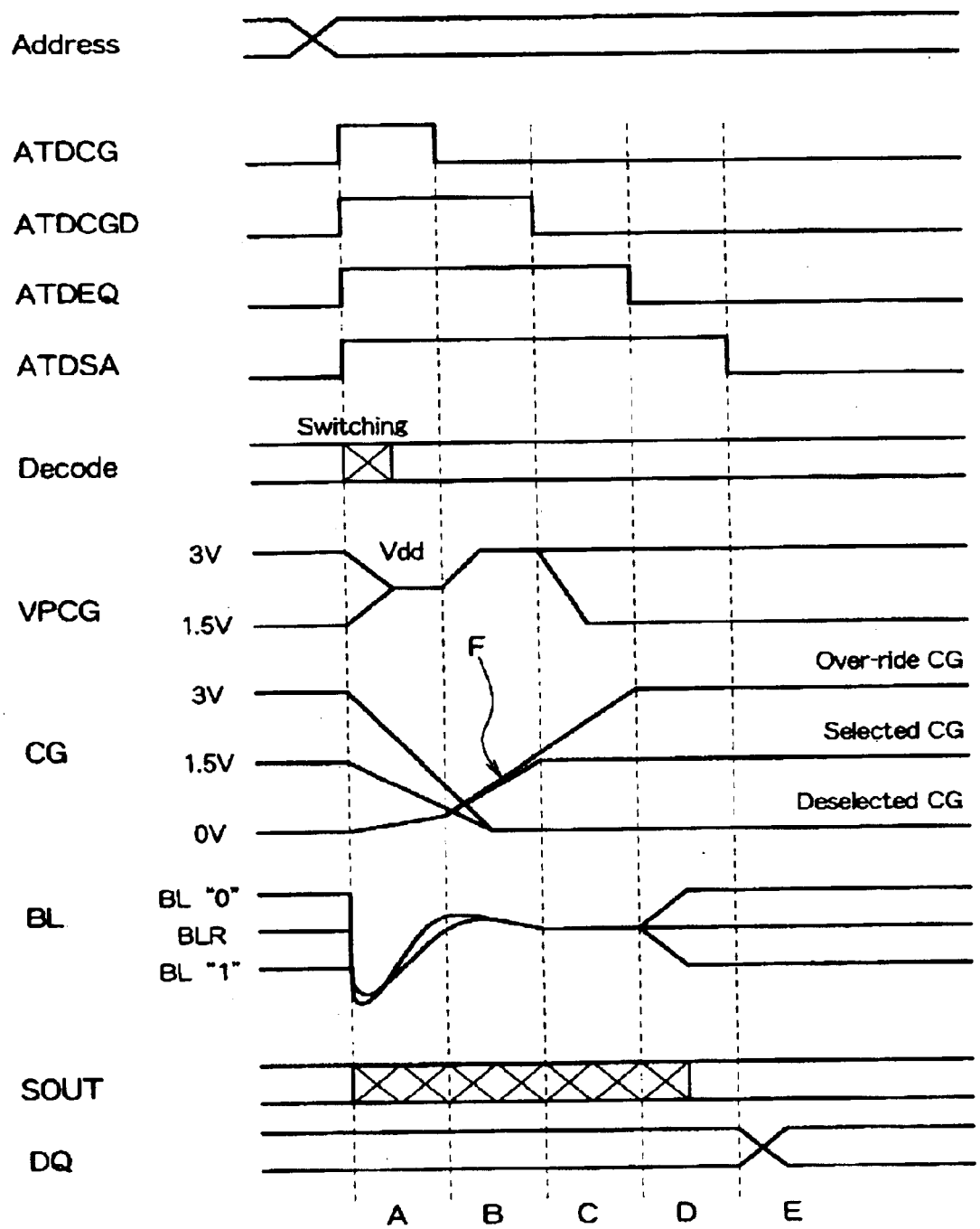
FIG. 12 is a timing chart showing the operation of the control gate voltage control circuit shown in FIG. 11.

The configuration and operation of this control gate voltage control circuit EOCTL will be described with reference to the timing chart shown in FIG. 12. FIG. 12 shows the timing chart at a data read operation time. In FIG. 12, time is divided into a first stage A to a fifth stage E on the time axis to execute the data read operation by setting the control gate line CG to the final voltage (0 V, 1.5 V and 3 V) after an address signal for selecting the nonvolatile memory cell is changed. A data program operation differs from the data read operation only in the set voltage (0 V, 2.5 V and 5.5 V), and can be executed similarly to the timing chart shown in FIG. 12.

Therefore, it is possible to use a first address transition signal ATCG set to be active, for example, high at the first stage A, a second address transition signal ATDCD set to be high at the first stage A and second stage B, a third address transition signal ATDEQ set to be high at the first to third stages A to C, and a fourth address transition signal ATDSA set to be high at the first to fourth stages A to D.

(1) First Stage A (Disconnecting Stage from Booster Circuit)

The first stage A shown in FIG. 12 is a process for disconnecting (setting a disconnection state) the control gate voltage control circuit EOCTL and the booster circuit 430. At the first stage A, when the address signal (address) for selecting the nonvolatile memory cell is changed, the first address transition signal ATDCG inputted to a terminal 450 shown in FIG. 11 is set to be high for a predetermined period as shown in FIG. 12. Here, since one sector 210 among 64 sectors is selected by an upper address signal A[20-15], a control signal NESEC corresponding to this selected sector 210 becomes high and is inputted to a terminal 451 shown in FIG. 11.

Figure 13:
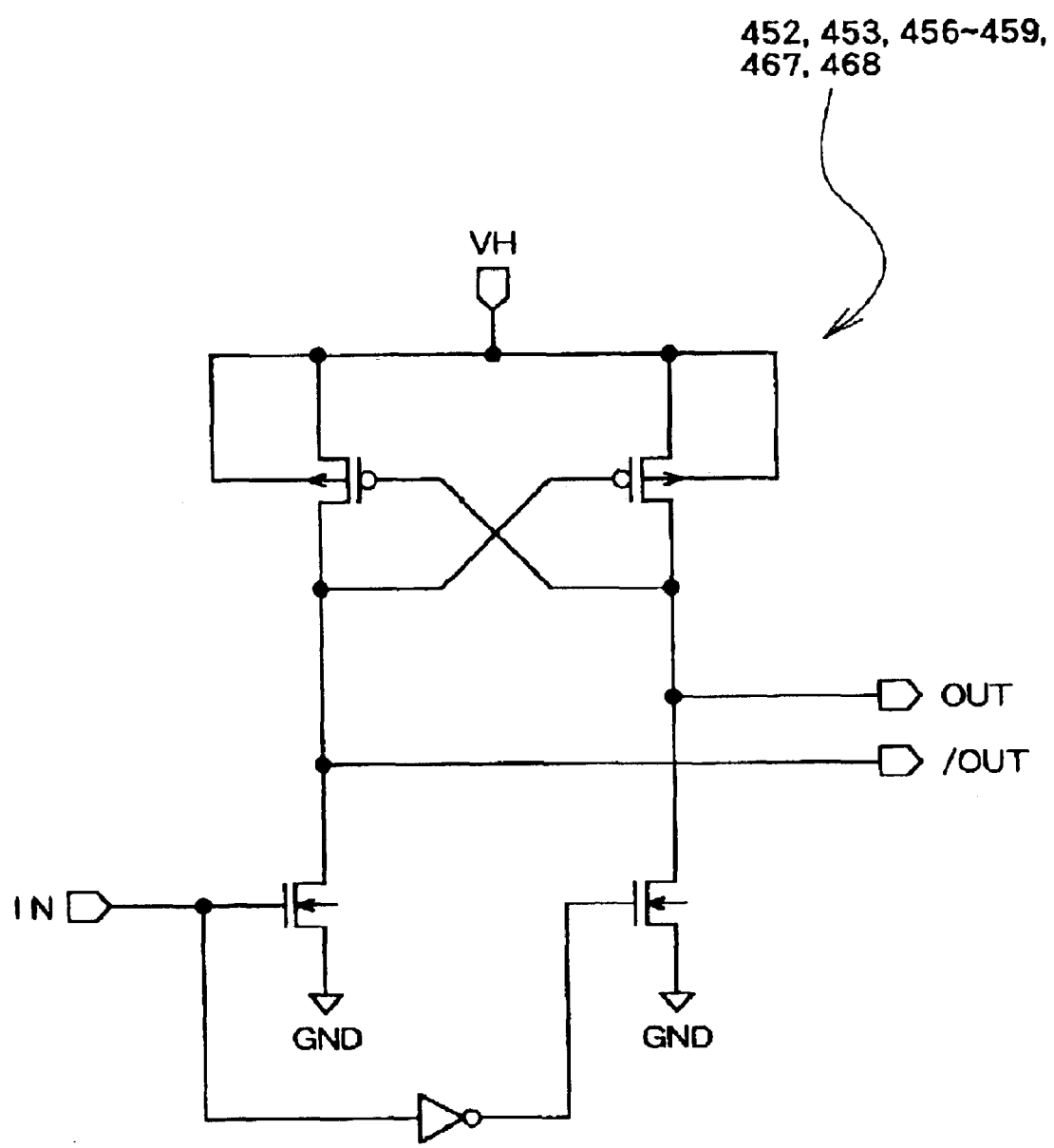
FIG. 13 is a circuit diagram showing one example of a high voltage switch shown in FIGS. 11 and 14.

Here, each of first to sixth high voltage switches 452, 453 and 456 to 459 shown in FIG. 11 has a common configuration shown in FIG. 13. Namely, if a signal inputted to an input terminal IN is high in voltage, its output OUT becomes high (VH) and its inverted output/OUT becomes low (0 V). If the signal inputted to the input terminal IN is reversely low, its output OUT becomes low (0 V) and its inverted output/OUT becomes high (HV).

In FIG. 11, when both the first address transition signal ATDCG and the control signal NESEC become high, the output OUT of the first high voltage switch 452 becomes high via a logic circuit connected to the terminals 450 and 451, and the P-type transistor 440 is turned off. Accordingly, in the control gate voltage control circuit EOCTL, the connection of the first voltage input terminal 421 and the first and second voltage output terminals 425 and 426 is released.

On the other hand, the inverted output/OUT of the second high voltage switch 453 becomes low and the P-type transistor 445 is turned on so that the supply path of the power supply voltage Vdd is formed.

At this first stage A, a control signal PVPCG inputted to a terminal 454 shown in FIG. 11 is high or low, and a second address transition signal ATDCGD inputted to a terminal 455 is high. When the first and second address transition signals ATDCG, ATDCGD and the control signals NESEC, PVPCG and ATDCGD are set to the above logic, both the outputs OUT of third and fifth high voltage switches 456 and 458 become high and P-type transistors 443 and 444 are turned off via a logic circuit connected to terminals 450, 451, 454 and 455. Accordingly, in the control gate voltage control circuit EOCTL, the second voltage input terminal 422 and the first and second voltage output terminals 425 and 426 are disconnected from each other. As a result, the control gate voltage control circuit EOCTL is disconnected from the booster circuit 430.

The reasons for such disconnection of the control gate voltage control circuit EOCTL and the booster circuit 430 at the first stage A are as follows.

At this first stage A, two pre-control gate line drivers (decoders) PCGDRV shown in FIG. 7 switch and output a driver selection signal PCG[3:0] based on a pre-decode output from the pre-decoder 400 in accordance with the transition of an address. The switching is also executed in the control gate line driver CGDRV shown in FIGS. 7 and 9 based on this driver selection signal PCG[0:3] (see the switching period of a decoder-driver shown in FIG. 12).

At this time, a through current temporarily flows to each control gate line driver CGDRV shown in FIG. 9 by a CMOS transistor 429 provided at the final stage of each control gate line driver CGDRV until the switching is completed. The voltage VPCG[0] or the voltage VPCG[1] is supplied from a first voltage output terminal 425 or a second voltage output terminal 426 (see FIG. 11) of the control gate voltage control circuit EOCTL to the source of this CMOS transistor 429 on its high potential side.

Here, if the control gate voltage control circuit EOCTL and the booster circuit 430 are connected at the first stage A, these voltages VPCG[0:1] are supplied from the booster circuit 430 shown in FIGS. 8 and 10. Since the booster circuit 430 has capacity elements C1, C2, C3, ... as shown in FIG. 10, electric charges charged to the capacity element at the final stage are particularly lost.

In contrast to this, in this embodiment, since the control gate voltage control circuit EOCTL and the booster circuit 430 are disconnected from each other at the first stage A, no drop of the electric charges is caused in the capacity element at the final stage of the booster circuit 430. Accordingly, a consumed current is correspondingly reduced.

In this embodiment, a first pre-drive stage for pre-driving the control gate line CG is set at this first stage A by another voltage instead of the voltage from the booster circuit 430. It is sufficient if this first pre-drive voltage is a voltage from a portion except for the booster circuit 430, but the first pre-drive voltage is set to the power supply voltage Vdd in this embodiment.

Namely, the power supply voltage Vdd from the power terminal 424 shown in FIG. 11 instead of the voltages VPCGL, VPCGH from the booster circuit 430 is supplied to the first and second voltage output terminals 425 and 426 at the first stage A. Since the inversion outputs/OUT of fourth and fifth high voltage switches 457 and 459 become low at this first stage A, P-type transistors 441 and 442 are turned on and the power supply voltage Vdd is supplied to the first and second voltage output terminals 425 and 426 via the P-type transistor 445. Thus, the through current in the CMOS transistor 429 can be reduced by performing the switching at a voltage lower than the voltage VPCGH (3 V or 5.5 V).

The above operations are summarized as shown in the following Table 2.

TABLE 2

| First stage A | Signal | | | Output of high voltage switch | | | | | |
|---|---|---|---|---|---|---|---|---|---|
| | ATDCG | NESEC | PVPCG | ATDCGD | 452 | 453 | 456 | 457 | 458 | 459 |
| | H | H | L/H | H | H | L | H | L | H | L |
| | | ON/OFF state of transistor | | | | | First and second voltage output terminals | | | |
| | 440 | 441 | 442 | 443 | 444 | 445 | 425 | | 426 | |
| | OFF | ON | ON | OFF | OFF | ON | Vdd | | Vdd | |

As a result, at the first stage A, the first and second voltage output terminals 425 and 426 shown in FIG. 11 are set to the power supply voltage Vdd (e.g., 1.8 V) from a state set to 1.5 V and 3 V, for example, at the previous data read time as shown by the voltage VPCG in FIG. 12.

On the other hand, the voltage of each control gate line CG shown in FIG. 12 and previously set to for example, 1.5 V and 3 V is lowered to 0 V by the switching. The voltage of each control gate line CG previously set to 0 V is raised by supplying the power supply voltage Vdd.

(2) Second Stage B (Pre-Drive Stage)

The operation of the control gate voltage control circuit at the second stage B shown in FIG. 12 will next be described. At this second stage B, the first address transition signal ATDCG set to be high at the first stage A is changed to a low voltage.

Thus, each state at the first stage A shown in Table 2 is provided as shown in the following Table 3 at the second stage B.

set to the voltage VPCGH from a state set to the power supply voltage Vdd (e.g., 1.8 V) at the first stage A as shown by the voltage VPCG in FIG. 12, and a pre-drive stage (pre-drive period) is set.

The reasons for performing the pre-driving by VPCGH (3 V) without respectively setting the first and second output terminals 425 and 426 to VPCGL (1.5 V) and VPCGH (3 V) as final voltages at this second stage B are as follows.

This is because that the voltage of each control gate line CG directed to the different final voltage (1.5 V and 3 V) is raised approximately by the same inclination (about the same current driving ability) at this second stage B as shown by an arrow F in FIG. 12. In other words, the voltage supplied to the source of the CMOS transistor 429 at the final stage of the control gate line driver CGDRV shown in FIG. 9 is equally set (both are set to VPCGH), and the current driving ability of the CMOS transistor 429 is equally set. Thus, both the voltages $V_{GS}$ between the gates and the sources of two CMOS transistors 429 set to the different final voltages are set to be equal to each other. Thus, the control gate line CG raised from 0 V at the first stage A early reaches the final voltage (1.5 V and 3 V). If VPCGL (1.5 V) is supplied to the source of one CMOS transistor 429, the current driving ability is reduced in comparison with the other CMOS transistor 429 in which VPCGH (3 V) is supplied to the source.

TABLE 3

| Second stage B | Signal | | | Output of high voltage switch | | | | | |
|---|---|---|---|---|---|---|---|---|---|
| | ATDCG | NESEC | PVPCG | ATDCGD | 452 | 453 | 456 | 457 | 458 | 459 |
| | L | H | L/H | H | L | H | L | H | L | H |
| | | ON/OFF state of transistor | | | | | First and second voltage output terminals | | | |
| | 440 | 441 | 442 | 443 | 444 | 445 | 425 | | 426 | |
| | ON | OFF | OFF | ON | ON | OFF | VPCGH | | VPCGH | |

As shown in Table 3, at the second stage B, both P-type transistors 441 and 442 on the way to the supply of the voltage VPCGL are turned off, and only P-type transistors 443 and 444 on the way to the supply of the voltage VPCGH are turned on. Accordingly, the voltage VPCGH is supplied to both the first and second voltage output terminals 425 and 426 shown in FIG. 11.

As this result, at the second stage B, both the first and second output terminals 425 and 426 shown in FIG. 11 are (3) Third Stage C (Setting Stage to Final Voltage)

The operation of the control gate voltage control circuit at a third stage C shown in FIG. 12 will next be described. At this third stage C, the second address transition signal ATDCGD set to be high at the second stage B is changed to a low voltage. At this third stage C, the operation is different in accordance with the low or high voltage of the control signal PVPCG. The following Table 4 shows these two kinds of operating results.

TABLE 4

| Third stage C | PVPCG = L | | Signal | | | | Output of high voltage switch | | | | |
|---|---|---|---|---|---|---|---|---|---|---|---|
| | | ATDCG | NESEC | PVPCG | ATDCGD | 452 | 453 | 456 | 457 | 458 | 459 |
| | | L | H | L | L | L | H | H | L | L | H |
| | | ON/OFF state of transistor | | | | | | Voltage output terminal | | | |
| | | 440 | 441 | 442 | 443 | 444 | 445 | 425 | | 426 | |
| | | ON | ON | OFF | OFF | ON | OFF | VPCGL | | VPCGH | |
| | PVPCG = H | | Signal | | | | Output of high voltage switch | | | | |
| | | ATDCG | NESEC | PVPCG | ATDCGD | 452 | 453 | 456 | 457 | 458 | 459 |
| | | L | H | H | L | L | H | L | H | H | L |
| | | ON/OFF state of transistor | | | | | | Voltage output terminal | | | |
| | | 440 | 441 | 442 | 443 | 444 | 445 | 425 | | 426 | |
| | | ON | OFF | ON | OFF | OFF | OFF | VPCGH | | VPCGL | |

As shown in Table 4, when the control signal PVPCG is low in voltage, the voltage VPCGL is supplied to the first voltage output terminal 425, and the voltage VPCGH is supplied to the second voltage output terminal 426. In contrast to this, when the control signal PVPCG is high in voltage, the supply voltages to the first and second voltage output terminals 425 and 426 are reverse to those in the case in which the control signal PVPCG is low in voltage.

As this result, at the third stage C, both the first and second output terminals 425 and 426 shown in FIG. 11 are changed to the voltage VPCGH or the voltage VPCGL as a set voltage as shown by the voltage VPCG in FIG. 12 from a state set to the voltage VPCGH at the second stage B.

A third address transition signal ATDEQ can be also used as a signal for equalizing a bit line pair (BL) shown in FIG. 12. At the first to third stages A to C at which this third address transition signal ATDEQ is high in voltage, the potential of the bit line pair (BL) shown in FIG. 12 is equalized and converged to a bit line reference potential (BLR).

As shown in FIG. 12, each control gate voltage CG is set to the final voltage near the final period of the third stage C, and the voltage of the bit line BL of a selected nonvolatile memory cell begins to be changed in accordance with its memory state at the fourth stage D. When sensing is performed during the change in the potential of the bit line BL, the sense amplifier judges the memory state in error. Therefore, the sense amplifier output SOUT is masked at the first to fourth stages A to D at which the fourth address transition signal ATDSA is high in voltage.

(5) Fifth Stage E (Read Data Output Stage)

At a fifth stage E after the fourth address transition signal ATDSA shown in FIG. 12 is changed from the high voltage to the low voltage, the latch state of a data output previously read is released and a sensing result of the bit line BL connected to the nonvolatile memory selected this time is continuously outputted by latching the output DQ.

Here, the following Table 5 shows the relation of an address signal A[12:14] of three bits for selecting one of nonvolatile memory cells (No.1 to No.7) of 8 bits adjacent to each other on one line, the above control signal PVPCG, and the potentials of control gate lines CG0 to CG3 at the read time.

TABLE 5

| No. | A14 | A13 | A12 | PVPCG | GCG3 | GCG2 | GCG1 | GCG0 |
|---|---|---|---|---|---|---|---|---|
| 0 | 0 | 0 | 0 | L | L | L | H(3.0 V) | H(1.5 V) |
| 1 | 0 | 0 | 1 | H | L | L | H(1.5 V) | H(3.0 V) |
| 2 | 0 | 1 | 0 | H | L | H(3.0 V) | H(1.5 V) | L |
| 3 | 0 | 1 | 1 | L | L | H(1.5 V) | H(3.0 V) | L |
| 4 | 1 | 0 | 0 | L | H(3.0 V) | H(1.5 V) | L | L |
| 5 | 1 | 0 | 1 | H | H(1.5 V) | H(3.0 V) | L | L |
| 6 | 1 | 1 | 0 | H | H(1.5 V) | L | L | H(3.0 V) |
| 7 | 1 | 1 | 1 | L | H(3.0 V) | L | L | H(1.5 V) |

(4) Fourth Stage D (Masking Stage of Sense Amplifier Output)

At a fourth stage D shown in FIG. 12, the third address transition signal ATDEQ set to be high at the third stage C is changed to a low voltage. As this result, the equalization of the bit line BL is completed and a data read operation is started. However, at the fourth stage D, a fourth address transition signal ATDSA shown in FIG. 12 is set to be high in voltage. This fourth address transition signal ATDSA can be used to mask a sense amplifier output SOUT shown in FIG. 12. Accordingly, latch data DQ at the previous read time are continuously outputted and no data DQ at the present read time are outputted until these first to fourth stages A to D. The reasons for this are as follows.

As shown in Table 5, at the read time, it can be seen that two of the control gate lines CG0 to CG3 are set to a high potential H (LPCGL=1.5 or LPCGH=3.0 V) and the other two are set to a low potential L (=0 V) in accordance with the logic of the address A[12:14] and the control signal PVPCG.

The above operation is similarly executed at the program time, and this operation is shown in the following Table 6.

TABLE 6

| No. | A14 | A13 | A12 | PVPCG | GCG3 | GCG2 | GCG1 | GCG0 |
|---|---|---|---|---|---|---|---|---|
| 0 | 0 | 0 | 0 | H | L | L | H(2.5 V) | H(5.5 V) |
| 1 | 0 | 0 | 1 | L | L | L | H(5.5 V) | H(2.5 V) |
| 2 | 0 | 1 | 0 | L | L | H(2.5 V) | H(5.5 V) | L |
| 3 | 0 | 1 | 1 | H | L | H(5.5 V) | H(2.5 V) | L |
| 4 | 1 | 0 | 0 | H | H(2.5 V) | H(5.5 V) | L | L |
| 5 | 1 | 0 | 1 | L | H(5.5 V) | H(2.5 V) | L | L |
| 6 | 1 | 1 | 0 | L | H(5.5 V) | L | L | H(2.5 V) |
| 7 | 1 | 1 | 1 | H | H(2.5 V) | L | L | H(5.5 V) |

As shown in Table 6, at the program time, it can be seen that two of the control gate lines CG0 to CG3 are set to the high potential H (LPCGL=2.5 or LPCGH=5.5 V) and the other two are set to the low potential L (=0 V) in accordance with the logic of the address A[12:14] and the control signal PVPCG.

Figure 14:
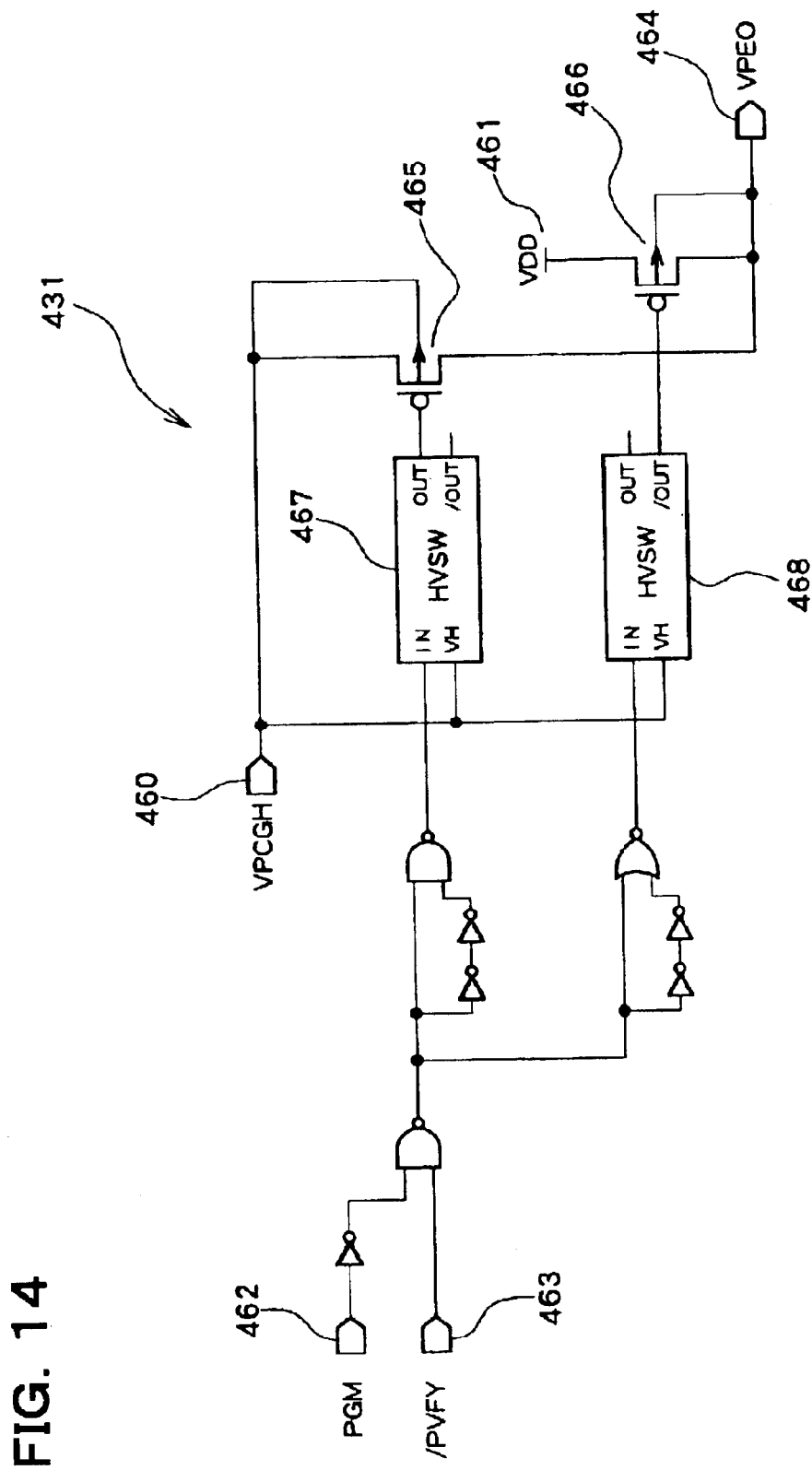
FIG. 14 is a circuit diagram showing one example of a well voltage varying circuit shown in FIG. 8.

The well voltage varying circuit 431 shown in FIG. 8 will next be described. FIG. 14 shows one example of this well voltage varying circuit 431. This well voltage varying circuit 431 sets a well voltage VPEO to the power supply voltage Vdd when data is read, and also sets the well voltage to a voltage VPLGH (=5.5 V) when data is programmed.

Therefore, as shown in FIG. 14, the well voltage varying circuit 431 has a terminal 460 for supplying the voltage VPCGL thereto from the booster circuit 430, and a terminal 461 for supplying the power supply voltage Vdd thereto. Further, the well voltage varying circuit 431 has a terminal 462 for inputting a control signal PGM set to be active (e.g., high) thereto at the program time, and a terminal 463 for inputting a control signal /PVFY set to be active (e.g., high) thereto at the read time.

A P-type transistor 465 is provided within a path for supplying the voltage VPCGH from the terminal 460 to an output terminal 464 of the well voltage varying circuit 431. A P-type transistor 466 is provided within a path for supplying the power supply voltage Vdd from the terminal 461 to the output terminal 464.

A high voltage switch 467 for controlling the gate voltage of the P-type transistor 465, and a high voltage switch 468 for controlling the gate voltage of the P-type transistor 466 respectively have a common configuration shown in FIG. 13.

In the well voltage varying circuit 431 shown in FIG. 14, the control signal PGM=L and the control signal/PVFY=H are set when data is read. At this time, a high voltage (VH=VPCGH=3 V) is outputted from the high voltage switch 467 and a low voltage is outputted from the high voltage switch 468 via a logic circuit connected to the terminals 462 and 463. Accordingly, the P-type transistor 465 is turned off and the P-type transistor 466 is turned on, and the power supply voltage Vdd is outputted as the well voltage VPEO from the output terminal 464. The logic at the data program time is reverse to that at the data read time. Accordingly, the P-type transistor 465 is turned on and the P-type transistor 466 is turned off, and the voltage VPLGH (=5.5 V) at the program time is outputted as the well voltage VPEO from the output terminal 464.

The reasons for varying the well voltage VPEO in accordance with modes are as follows. As shown in FIG. 11, this well voltage VPEO is connected to the wells of P-type transistors 440 and 445. As mentioned above, the P-type transistor 445 of FIG. 11 is turned on at the first stage A of FIG. 12. Since the drain of this P-type transistor 445 is connected to the drain of the P-type transistor 440, the drain of the P-type transistor 440 becomes the power supply voltage Vdd at the first stage A.

Here, a PN diode is formed between the drain (N-type) and the well (P-type) of the P-type transistor 440. Accordingly, when the well voltage (substrate voltage) of the P-type transistor 440 is lower than the power supply voltage Vdd at the first stage A, a reverse current flows into the well through the PN diode between the drain and the well of the P-type transistor 440. Accordingly, it is necessary to set the well voltage (substrate voltage) of the P-type transistor 440 to the power supply voltage Vdd or more at any time.

Further, when the P-type transistor 440 shown in FIG. 11 is turned on at the third stage C shown in FIG. 12, the voltage VPCGL is supplied to the drain of the P-type transistor 445. Accordingly, it is necessary to set the well voltage (substrate voltage) of the P-type transistor 445 to the voltage VPCGL or more so as not to flow the reverse current to the well of the P-type transistor 445 through the PN diode between the drain and the well of the P-type transistor 445 in this case. The voltage VPCGL is 1.5 V when data is read, and is 2.5 V when data is programmed. Accordingly, the well voltage VPEO common to both the P-type transistors 440 and 445 is set to the voltage VPCGH=5.5 V when data is programmed so as not to flow the drain-well current to both the P-type transistors 440 and 445 at the data read time and the data program time.

However, it is necessary to newly generate the voltage 5.5 V when data is read so as to secure only the well voltage VPEO. Further, when a case for turning-on the P-type transistor 440 at the data read time (after the third stage C of FIG. 12) is considered, the ability of the P-type transistor 440 becomes worse by a so-called substrate bias effect since the voltage 5.5 V higher than the source voltage VPCGL= 1.5 V of the P-type transistor 440 becomes the well voltage.

Therefore, in this embodiment, the voltage VPEO commonly used for the wells of the P-type transistors 440 and 445 is varied at the data read time and the data program time.

From the above description, the condition to be satisfied by the well voltage VPEO at the data read time becomes Vdd (1.8)≦VPEO from the viewpoint that no reverse current flows between the drain and the well of the P-type transistor 440. In this case, an excessive voltage larger than the voltage VPCGL (1.5 V) should be avoided from the viewpoint that no driving ability of the P-type transistor 440 is reduced. An optimum well voltage VPEO satisfying both these conditions is the power supply voltage Vdd (1.8 V).

On the other hand, the condition to be satisfied by the well voltage VPEO at the data program time becomes VPCGL (2.5 V)≦VPEO from the viewpoint that no drain-well current flows to the P-type transistor 445. Therefore, in this embodiment, the well voltage VPEO at the data program time is set to the voltage VPCGH (5.5 V) at the data program time.

The present invention is not limited to the above embodiments, but can be variously modified and embodied within the scope of the features of the present invention.

The present invention is characterized in the setting of the control gate voltage. The detailed descriptions of the voltage setting of the word line and the bit line, and the read operation, the program operation and the erasing operation of the nonvolatile memory cell are omitted. However, if necessary, these descriptions are described in detail in U.S. patent application Ser. No. 09/955,160, and the like, as prior applications filed by the applicant of the present application.

What is claimed is:

1. A nonvolatile semiconductor memory device comprising:

a memory cell array region in which a plurality of nonvolatile memory cells are arranged, each of the nonvolatile memory cells including a control gate; and a control gate voltage generation section which generates a voltage driving the control gate of each of the nonvolatile memory cells in the memory cell array region, wherein the control gate voltage generation section includes:

a booster circuit which generates a plurality of voltages; and a voltage control circuit which includes a plurality of voltage output terminals, the voltage control circuit switching and outputting the voltages from the booster circuit to the voltage output terminals in accordance with a selection state of the nonvolatile memory cells, and wherein the voltage control circuit outputs a maximum voltage among the voltages to the voltage output terminals commonly during a pre-drive period which is a period before the voltages are outputted from the voltage output terminals.

2. The nonvolatile semiconductor memory device as defined by claim 1, further comprising:

a plurality of control gate drivers, each of the control gate drivers including a CMOS transistor which selects one voltage between one of the voltages from the voltage control circuit and a voltage equal to or lower than a ground voltage, and supplies the selected voltage to the control gate, and the CMOS transistor being switched in accordance with a change of a memory address, wherein the voltage control circuit sets the pre-drive period after a switching period of the CMOS transistor has passed.

3. The nonvolatile semiconductor memory device as defined by claim 2, wherein the voltage control circuit sets the pre-drive period over a predetermined period based on an address transition signal which changes at a transition time of the memory address.

4. The nonvolatile semiconductor memory device as defined by claim 2, wherein the voltage control circuit has first and second voltage input terminals and first and second voltage output terminals, and controls switching of a connection state between the first and second voltage input terminals and the first and second voltage output terminals in accordance with the selection state of the nonvolatile memory cells.

5. The nonvolatile semiconductor memory device as defined by claim 4, wherein in the voltage control circuit, a first control gate selection voltage is inputted to the first voltage input terminal and a first override voltage higher than the first control gate selection voltage is inputted to the second voltage input terminal when data is read, and the first override voltage is outputted from the first and second voltage output terminals during the pre-drive period.

6. The nonvolatile semiconductor memory device as defined by claim 5, wherein in the voltage control circuit, a second control gate selection voltage is inputted to the first voltage input terminal and a second override voltage higher than the second control gate selection voltage is inputted to the second voltage input terminal when data is programmed, and the second override voltage is outputted from the first and second voltage output terminals during the pre-drive period.

7. The nonvolatile semiconductor memory device as defined by claim 4, wherein the voltage control circuit is set to a disconnection state, in which no voltage is outputted from the booster circuit to both of the first and second voltage output terminals, in a period including the switching period of the CMOS transistor.

8. The nonvolatile semiconductor memory device as defined by claim 7, wherein the voltage control circuit outputs a power supply voltage to the first and second voltage output terminals in the period including the switching period of the CMOS transistor.

9. The nonvolatile semiconductor memory device as defined by claim 1, further comprising:

a plurality of bit lines connected to the nonvolatile memory cells, respectively, and wherein the voltage control circuit finishes the pre-drive period before a bit line equalizing period, in which adjacent bit lines become the same potential, finishes.

10. The nonvolatile semiconductor memory device as defined by claim 1, wherein memory cells are arranged in a row direction and a column direction in the memory cell array region, each of the memory cells having one word gate, and first and second nonvolatile memory cells controlled by first and second control gates.

* * * * *